United States Patent
Watanabe et al.

[11] Patent Number: 6,106,993
[45] Date of Patent: *Aug. 22, 2000

[54] CHEMICALLY AMPLIFIED POSITIVE RESIST COMPOSITION

[75] Inventors: Satoshi Watanabe; Osamu Watanabe; Shigehiro Nagura; Toshinobu Ishihara, all of Nakakubiki-gun, Japan

[73] Assignee: Shin-Etsu Chemical Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 09/114,067

[22] Filed: Jul. 13, 1998

Related U.S. Application Data

[63] Continuation of application No. 08/727,212, Oct. 8, 1996, abandoned.

[30] Foreign Application Priority Data

| Oct. 9, 1995 | [JP] | Japan | 7-287944 |
| Oct. 9, 1995 | [JP] | Japan | 7-287945 |
| Dec. 1, 1995 | [JP] | Japan | 7-337900 |
| Dec. 1, 1995 | [JP] | Japan | 7-337901 |

[51] Int. Cl.$^7$ ................................ G03F 7/004
[52] U.S. Cl. .................. 430/270.1; 430/170; 430/905
[58] Field of Search .......................... 430/270.1, 905, 430/170

[56] References Cited

U.S. PATENT DOCUMENTS

| 5,350,660 | 9/1994 | Urano et al. | 430/176 |
| 5,352,564 | 10/1994 | Takeda et al. | 430/270.1 |
| 5,558,976 | 9/1996 | Urano et al. | 430/270.1 |
| 5,658,706 | 8/1997 | Niki et al. | 430/270.1 |
| 5,876,900 | 3/1999 | Watanabe et al. | 430/288.1 |

*Primary Examiner*—John S. Chu
*Attorney, Agent, or Firm*—Millen, White, Zelano & Branigan, P.C.

[57] ABSTRACT

A chemically amplified positive resist composition contains (A) an organic solvent, (B) a base resin, (C) a photoacid generator, and optionally, (D) a dissolution rate regulator. The base resin (B) is a hydroxystyrene copolymer having different acid labile groups and Mw of 3,000–300,000. The resist composition is highly sensitive to actinic radiation such as deep-UV, electron beam and X-ray, can be developed with aqueous base to form a pattern, and is thus suitable for use in a fine patterning technique.

33 Claims, 1 Drawing Sheet

CHEMICALLY AMPLIFIED POSITIVE RESIST COMPOSITION

This is a continuation of application Ser. No. 08/727,212 filed Oct. 8, 1996, now abandoned.

BACKGROUND OF THE INVENTION

1. Field of the Invention

This invention relates to a chemically amplified positive resist composition-which is highly sensitive to actinic radiation such as deep-UV, electron beam and X-ray, can be developed with alkaline aqueous solution to form a pattern, and is thus suitable for use in a fine patterning technique.

2. Prior Art

As the LSI technology tends toward higher integration and higher speed, further refinement of pattern rules is required. The current patterning technology mostly relies on light exposure which is now approaching to the essential limit of resolution which is dictated by the wavelength of a light source. It is generally recognized that in light exposure using g-line (wavelength 436 nm) or i-line (wavelength 365 nm) as a light source, a pattern rule of about 0.5 µm is the limit. For LSIs fabricated by such light exposure technique, a degree of integration equivalent to 16 mega-bit DRAM is the limit. At present, LSIs fabricated in the laboratory have reached this stage. It is urgently required to develop a finer patterning technique.

Under such circumstances, deep-ultraviolet lithography is regarded promising as the next generation of fine patterning technology. The deep-UV lithography is capable of working on the order of 0.3 µm or less. If a less light absorbing resist is used, it is possible to form a pattern having a side wall nearly perpendicular to the substrate.

Chemically amplified, positive working resist materials were recently developed using acid catalysts as disclosed in JP-B 2-27660, JP-A 63-27829, U.S. Pat. Nos. 4,491,628 and 5,310,619. While a high illuminance KrF excimer laser can be utilized as a deep-UV light source, these materials have high sensitivity, resolution and dry etching resistance and are promising as resist materials especially suited for deep-UV lithography.

The chemically amplified, positive resist materials being known include those of the two-component system comprising an alkali-soluble base resin and a photoacid generator and those of the three-component system comprising an alkali-soluble base resin, a photoacid generator, and a dissolution rate inhibitor having an acid labile group.

JP-A 62-115440 discloses a resist composition comprising poly-p-tert-butoxystyrene and a photoacid generator. Similarly, JP-A 3-223858 discloses a two-component system resist composition comprising a resin having a tert-butoxy group in its molecule and a photoacid generator and JP-A 4-211258 discloses a two-component system resist composition comprising a polyhydroxystyrene containing a methyl, isopropyl, tert-butyl, tetrahydropyranyl or trimethylsilyl group in its molecule and a photoacid generator.

Furthermore, JP-A 6-100488 proposes a resist composition comprising a polydihydroxystyrene derivative such as poly[3,4-bis(2-tetrahydropyranyloxy)styrene], poly[3,4-bis(tert-butoxycarbonyloxy)styrene], and poly[3,5-bis(2-tetrahydropyranyloxy)styrene] and a photoacid generator.

Since the base resins used in these resist compositions have a single acid labile group, such a resist composition forms a pattern which tends to have a T-top configuration if the acid labile group is a strong acid-decomposable one such as a tert-butyl and tert-butoxycarbonyl group. On the other hand, if the acid labile group is an alkoxyalkyl group such as ethoxyethyl which is decomposable with weak acid, the resist composition would be less satisfactory in sensitivity and resolution and form a pattern which will become extremely thin with the lapse of time from exposure to heat treatment.

None of the resist compositions thus far proposed are practically satisfactory. There is a desire to overcome these problems.

SUMMARY OF THE INVENTION

Therefore, an object of the invention is to provide a chemically amplified positive resist composition comprising a base resin which is improved such that the composition may have greater sensitivity, resolution, exposure margin and process adaptability than conventional resist compositions.

We have found that a polymer having a recurring unit of the general formula (1) shown below and having a weight average molecular weight of 3,000 to 300,000 is effective as a base resin of a chemically amplified positive resist composition. According to our discovery, a chemically amplified positive resist composition comprising the polymer, a photoacid generator, an organic solvent and optionally, a dissolution rate regulator forms a resist coating which has an enhanced dissolution contrast and especially, an increased dissolution rate after exposure and is improved in resolution, exposure margin and process adaptability. The composition is fully practical, advantageous in precise fine processing, and very useful as a ultra-LSI resist material.

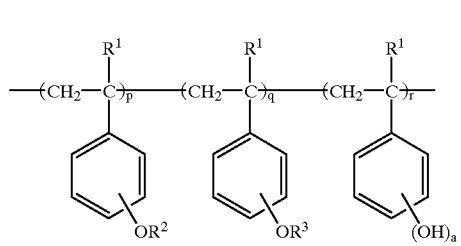

In formula (1), $R^1$ is a hydrogen atom or methyl group, $R^2$ and $R^3$ are different acid labile groups, letters p, q, and r are numbers satisfying $0.02 \leq p/(p+q+r) \leq 0.5$, $0.01 \leq q/(p+q+r) \leq 0.3$, $0 < (p+q)/(p+q+r) \leq 0.8$, and letter a is a positive number of 1 to 3.

The polymer of general formula (1) has phenolic hydroxyl groups some of which are protected with two types of acid labile groups. When this polymer is blended in a resist composition as a base resin, especially when among the two different acid labile groups, $R^2$ is an alkoxyalkyl group of the general formula (2) shown below such as ethoxyethyl, ethoxypropyl, and butoxyethyl and $R^3$ is a carbonyl-bearing group of the general formula (3) shown below such as tert-butoxycarbonyl (t-BOC) or tetrahydropyranyl, tetrahydrofuranyl or trialkylsilyl group, the resulting resist composition can take out the advantages as resist material associated with the two different acid labile groups, that is, alkali dissolution inhibition by the carbonyl or other 1s acid labile group represented by $R^3$ and ease of coupling-off by the alkoxyalkyl group represented by $R^2$, in such a manner as to compensate for the drawback appearing when each acid labile group is introduced alone.

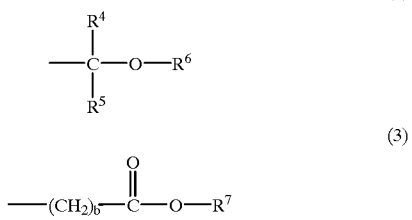

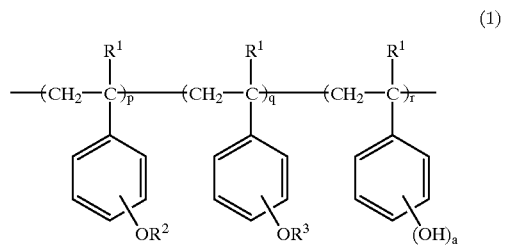

In the formulae, $R^4$ and $R^5$ are independently selected from the group consisting of a hydrogen atom and normal or branched alkyl group having 1 to 6 carbon atoms, $R^6$ is a normal, branched or cyclic alkyl group having 1 to 10 carbon atoms, $R^7$ is a normal or branched alkyl group having 1 to 6 carbon atoms, and letter b is equal to 0 or 1.

More particularly, a polymer wherein an alkoxyalkyl group represented by formula (2) is introduced alone is unlikely to take a T-top configuration since coupling-off reaction takes place with the aid of weak acid. However, since the polymer is sensitive to acid as previously mentioned, the pattern will become extremely thin with the lapse of time from exposure to heat treatment. Since the dissolution inhibition effect against alkali is low, a high substitution polymer must be used in order to provide a dissolution contrast. This leads to a lack of heat resistance.

On the other hand, if a polymer wherein a phenolic hydroxyl group is solely protected with a t-BOC group is blended in resist material, there are obtained advantages that alkali dissolution inhibition is effective, a dissolution contrast is available with a low rate of substitution, and heat resistance is high. In order to couple off the acid labile group to render the polymer alkali soluble, a strong acid such as trifluoromethanesulfonic acid must be present. The use of strong acid leads to the drawback that the pattern tends to be T-top configured.

In contrast to these polymers, the inventive polymer wherein phenolic hydroxyl groups are protected with two types of acid labile groups having different characteristics functions in a resist material such that the drawbacks of the respective acid labile groups are compensated for without losing the advantages thereof.

When a dissolution rate regulator is further blended in resist material, the resist coating is increased in dissolution contrast, especially dissolution rate after exposure. Since the dissolution rate regulator is well compatible with the base resin of formula (1) and photoacid generator, it functions to increase the dispersion of the photoacid generator, increase the density of the matrix, and achieve microscopically uniform and controlled migration of an acid generated after exposure, resulting in improved resolution and rectangularity. In a patterning process including exposure, heating and development, the alkali soluble resin as the matrix in the unexposed area is suppressed in dissolution rate. In the exposed area, the alkali soluble resin as the matrix is accelerated in dissolution rate in aqueous base solution because of decomposition of its acid labile group. Thus the aqueous base solution greatly penetrates into the resist coating so that the dissolution rate regulator is quickly dissolved whereby blocks of the still undissolved alkali soluble resin are released into the aqueous base solution. This results in a quick increase of apparent alkali dissolution.

It has been found that a chemically amplified positive working resist composition comprising a polymer of formula (1) as a base resin substantially suppresses the problems of the prior art including frequent formation of a T-top configuration, thinning of a resist pattern, and lack of heat resistance, and possesses high sensitivity, high resolution, an ability to control the size and shape of a pattern as desired by a choice of composition, and process adaptability. The present invention is predicated on these findings.

According to the present invention, there is provided a chemically amplified positive resist composition comprising (A) an organic solvent, (B) a base resin, (C) a photoacid generator, and optionally, (D) a dissolution rate regulator.

The base resin (B) is a polymer having a recurring unit of the following general formula (1) and a weight average molecular weight of 3,000 to 300,000.

In formula (1), $R^1$, $R^2$, $R^3$, p, q, r, and a are as defined above.

BRIEF DESCRIPTION OF THE DRAWINGS

The only FIGURE.

DESCRIPTION OF THE PREFERRED EMBODIMENTS

Figure 1:
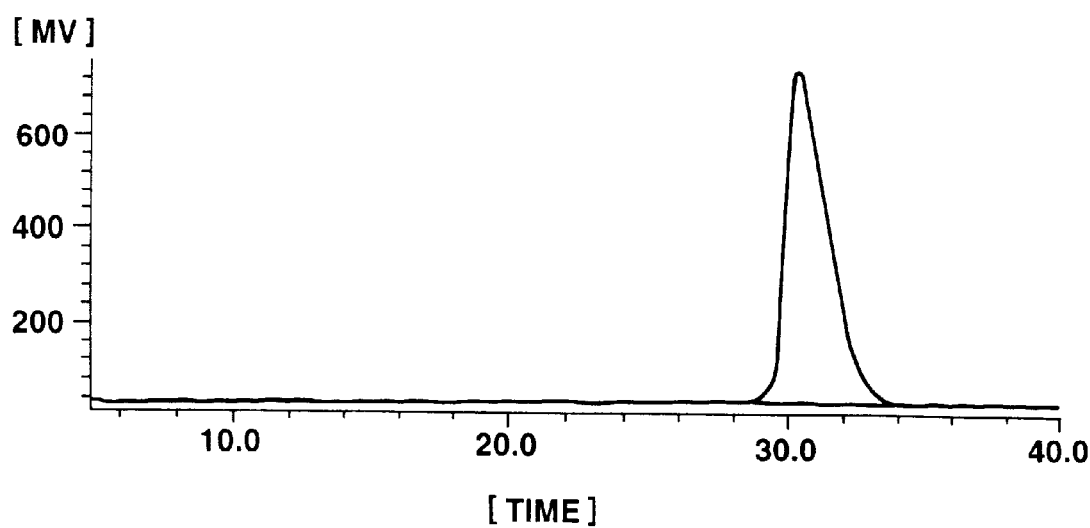
FIG. 1 is a graph showing a GPC elution curve of the polymer obtained in Synthetic Example 4.

Essential components of the chemically amplified positive resist composition according to the invention are (A) an organic solvent, (B) a base resin, and (C) a photoacid generator. Preferably the composition further contains (D) a dissolution rate regulator.

Any desired organic solvent may be used as component (A) insofar as components (B) to (D) are soluble therein. Examples of the organic solvent include ketones such as cyclohexanone and methyl-2-n-amylketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate and ethyl 3-ethoxypropionate, alone or in admixture of two or more. The preferred solvents are diethylene glycol dimethyl ether and 1-ethoxy-2-propanol because the acid generator of the resist composition is most soluble therein.

The amount of the organic solvent used is generally about 200 to 1,000 parts, preferably about 400 to 800 parts by weight per 100 parts by weight of the base resin. Compositions with less than 200 parts of the solvent would somewhat lack mutual miscibility of the components and film formability. Compositions with more than 1,000 parts of the solvent would form too thin films which are unacceptable in practice.

The base resin (B) is a copolymer having recurring units s shown by the following general formula (1).

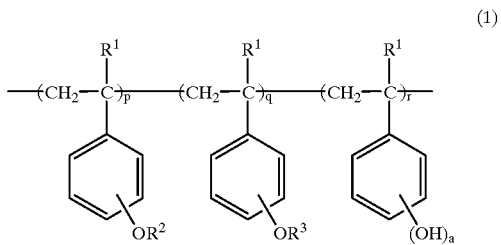

(1)

In formula (1), $R^1$ is a hydrogen atom or methyl group and $R^2$ and $R^3$ are different acid labile groups. Although the acid labile groups may be selected from a variety of such groups, it is preferred that $R^2$ be a group of formula (2) and $R^3$ be a group of formula (3), tetrahydropyranyl, tetrahydrofuranyl or trialkylsilyl group.

(2)

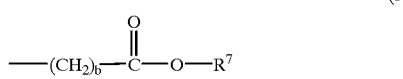

(3)

In formulae (2) and (3), $R^4$ and $R^5$ are independently a hydrogen atom or normal or branched alkyl group having 1 to 6 carbon atoms, and $R^6$ is a normal, branched or cyclic alkyl group having 1 to 10 carbon atoms, and $R^7$ is a normal or branched alkyl group having 1 to 6 carbon atoms, and letter b is equal to 0 or 1. Examples of the normal or branched alkyl group include methyl, ethyl, propyl, isopropyl, n-butyl, isobutyl, and tert-butyl groups. Cyclohexyl is exemplary of the cyclic alkyl group.

Examples of the acid labile group of formula (2) include methoxymethyl, ethoxyethyl, n-propoxyethyl, isopropoxyethyl, n-butoxyethyl, isobutoxyethyl, tert-butoxyethyl, cyclohexyloxyethyl, methoxypropyl, ethoxypropyl, 1-methoxy-1-methylethyl, and 1-ethoxy-1-methylethyl groups.

Examples of the acid labile group of formula (3) include tert-butoxycarbonyl and tert-butoxycarbonylmethyl groups. Examples of the trialkylsilyl group include those having a $C_1$–$C_6$ alkyl group, such as trimethylsilyl and tri-tert-butyldimethylsilyl groups.

With respect to the two types of acid labile groups in the polymer of formula (1), a choice is preferably made among the above-mentioned groups such that $R^2$ is an alkoxyalkyl group of formula (2) and $R^3$ is a tert-butoxycarbonyl group, particularly when characteristics of a resist composition having an inventive polymer blended as a base resin are taken into account.

Letters p, q, and r are numbers satisfying $0.02 \leq p/(p+q+r) \leq 0.5$, $0.01 \leq q/(p+q+r) \leq 0.3$, $0 < (p+q)/(p+q+r) \leq 0.8$, preferably $0.04 \leq p/(p+q+r) \leq 0.4$, $0.05 \leq q/(p+q+r) \leq 0.25$, $0.07 \leq (p+q)/(p+q+r) \leq 0.5$.

If any one of p, q and r is equal to 0 so that the polymer of formula (1) does not contain any of the three units, the contrast of alkali dissolution rate is reduced and resolution is exacerbated. If the ratio of p to the sum of p+q+r is less than 0.02 or if the ratio of q to the sum is less than 0.01, it is impossible to take advantage of the corresponding acid labile group. If the ratio of p to the sum is more than 0.5 or if the ratio of p+q to the sum is more than 0.8, a polymer has a low glass transition temperature and poor heat resistance, and a coating thereof experiences a thickness change, induces internal stresses, generates bubbles upon alkali development, and provides a weak bond to the substrate because of less hydrophilic groups. By properly selecting the values of p, q and r within the above-defined range, it becomes possible to control the size and shape of a resist pattern as desired.

Note that letter a is a positive number of 1 to 3.

In the polymer as a base resin according to the invention, the content of the acid labile groups affects the contrast of dissolution rate of a resist coating and governs the characteristics of a resist composition including pattern size and shape.

The polymer has a weight average molecular weight (Mw) of 3,000 to 300,000, preferably 3,000 to 30,000. With Mw<3,000, a resist composition is less resistant to heat. With Mw>300,000, a resist composition becomes low in alkali dissolution and tends to give rise to a footing phenomenon after pattern formation.

In the base resin according to the present invention, a wide molecular weight dispersity (Mw/Mn) means that there are present low molecular weight polymers and high molecular weight polymers. If low molecular weight polymers are predominant, heat resistance would be poor. If high molecular weight polymers are predominant, which means the presence of less alkali soluble components, a footing phenomenon occurs after pattern formation. As the pattern rule becomes finer, the influence of molecular weight and its dispersity becomes more significant. In order to provide a resist composition suitable for processing to fine pattern dimensions, the base resin is preferably a monodisperse polymer having a dispersity of 1.0 to 1.5, especially 1.0 to 1.3.

The polymer of formula (1) as a base resin according to the invention can be prepared by effecting radical polymerization of the following monomers in a conventional manner.

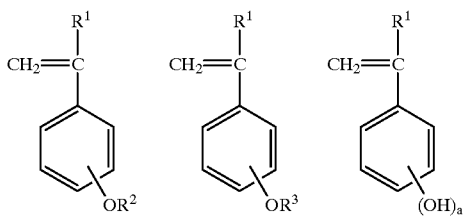

In the formulae, $R^1$, $R^2$, $R^3$ and a are as defined above.

When the polymer is applied to resist materials patternable to a finer pattern rule, a monodisperse polymer is preferred for the above-mentioned reason. Monodisperse polymers are generally prepared by fractionating a polymer formed by radical polymerization and having a wide molecular weight dispersity so as to collect a polymer fraction having a dispersity of 1.0 to 1.5.

More particularly, radical polymerization of monomers of the above-defined formulae is first carried out in a conventional manner using a polymerization initiator. Any of conventional polymerization initiators may be used in a conventional amount. Preferred are organic peroxides, especially organic peroxides having a 10-hour half-life temperature of 40 to 90° C. such as lauroyl peroxide.

The radical polymerization is preferably carried out in organic solvents. Useful organic solvents include aromatic hydrocarbon, cyclic ether, aliphatic hydrocarbon solvents such as benzene, toluene, tetrahydrofuran (THF), dioxane, tetrahydropyran, dimethoxyethane, n-hexane, and cyclohexane and mixtures thereof. Acetone is most preferred. The organic solvents may be used so as to give a monomer concentration of 10 to 50% by weight.

Radical polymerization conditions may be properly adjusted. Typically, reaction is carried out for about 3 to 10 hours at a temperature which is 20 to 50° C. higher than the 10-hour half-life temperature of the organic peroxide.

Alternatively, the polymer of the invention can be prepared by effecting radical polymerization or addition polymerization (living anion polymerization) of a monomer of the following formula (4), hydrolyzing the resulting polymer, and partially protecting hydroxyl groups introduced by hydrolysis with a first acid labile group of formula (2) and a second acid labile group of formula (3) through chemical reaction.

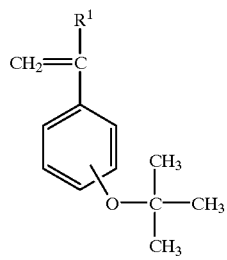

(4)

In formula (4), $R^1$ is as previously defined.

Monodisperse polymers are generally prepared by fractionating a polymer product formed by radical polymerization of monomers or by effecting addition polymerization so as to be monodisperse. Since the former fractionating method is complex, the latter addition polymerization method is desirably used. Some copolymers are desirably formed by radical polymerization because some monomers are not addition polymerizable.

When polymers of the invention are prepared by effecting radical polymerization of a monomer of formula (4), the same method as the first mentioned one is applicable.

Where polymers of the invention are prepared by living anion polymerization of a monomer of formula (4), well-known living anion polymerization initiators may be used. Particularly when it is desired to obtain a monodisperse polymer, organometallic compounds are preferably used among other living anion polymerization initiators. Useful organometallic compounds are organic alkali metal compounds such as n-butyl lithium, sec-butyl lithium, tert-butyl lithium, naphthalene sodium, naphthalene potassium, anthracene sodium, α-methylstyrenetetramer disodium, cumyl potassium, and cumyl cesium. The amount of living anion polymerization initiator added is determined from a design molecular weight (=weight of monomer/moles of initiator).

Living anion polymerization of the monomer is generally carried out in organic solvents. The organic solvents used herein are the same as mentioned for the radical polymerization, with tetrahydrofuran being especially preferred.

Adequate polymerization takes place when the monomer is present in a concentration of 1 to 30% by weight. Reaction is preferably carried out by agitating the reaction solution in high vacuum or in an inert gas atmosphere such as argon and nitrogen. The reaction temperature may be selected from a wide range from −78° C. to the boiling point of the reaction solution used. A temperature of −78° C. to 0° C. is preferred for the tetrahydrofuran solvent and room temperature is preferred for the benzene solvent.

Polymerization reaction proceeds for about 10 minutes to about 7 hours. Through this reaction, there is obtained a polymer having a recurring unit of the following general formula (5). Polymerization reaction can be stopped by adding a stopper such as methanol, water and methyl bromide to the reaction solution.

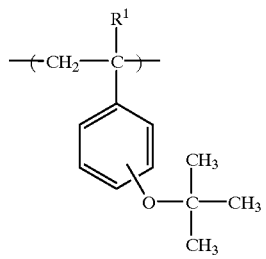

(5)

In formula (5), $R^1$ is as previously defined.

The living anion polymerization can produce a polymer having a molecular weight dispersity which is monodisperse, that is, Mw/Mn=1.0 to 1.5 because the monomer can be reacted 100% and the molecular weight be properly adjusted.

It is noted that the weight average molecular weight (Mw) of a polymer can be calculated from the weight of a monomer used and the moles (or number of molecules) of an initiator and measured by a light scattering method. The number average molecular weight (Mn) can be measured using a diaphragm osmometer. The molecular structure can be readily acknowledged by infrared (IR) absorption spectroscopy and $^1$H-NMR spectroscopy. The molecular weight dispersity can be determined by gel permeation chromatography (GPC).

According to the invention, a polymer which is monodisperse (that is, has a molecular weight dispersity of 1.0 to 1.5) and has a weight average molecular weight of 3,000 to 300,000 is obtained, as shown by the following reaction scheme, by hydrolyzing a tert-butyl group of a polymer of formula (5) preferably having a weight average molecular weight of 3,000 to 300,000 and a molecular weight dispersity of 1.0 to 1.5 to form a polyhydroxystyrene derivative, and successively protecting some of the hydroxyl groups resulting from hydrolysis with acid labile groups represented by $R^2$ and $R^3$.

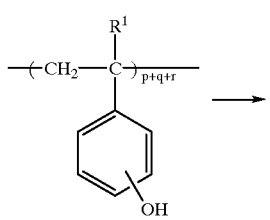

-continued

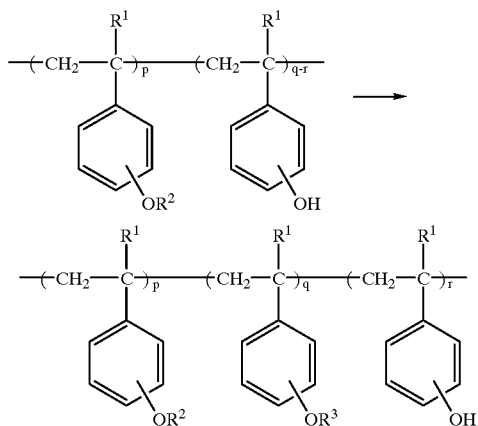

In the above reaction scheme, $R^1$, $R^2$, $R^3$, p, q, and r are as previously defined.

In particular, for hydrolysis of a polymer of formula (5), more specifically hydrolysis of a tert-butyl group which is a protective group for its hydroxyl group, an appropriate amount of acid such as hydrochloric acid and hydrobromic acid is added dropwise to a solution of the polymer in a solvent mixture of dioxane, acetone, acetonitrile, benzene, water and so forth. This procedure readily produces a hydroxyl-bearing polyhydroxystyrene derivative having a controlled molecular weight dispersity because neither cleavage of the polymer backbone nor crosslinking reaction between molecules occurs during reaction.

After the protective group for the hydroxyl group is detached by hydrolysis as mentioned above, acid labile groups represented by $R^2$ and $R^3$ can be introduced through chemical reaction for protection.

This reaction scheme is advantageous particularly when a polymer wherein $R^2$ is an alkoxyalkyl group is obtained. The alkoxyalkylation reaction is effected by adding a hydrogen atom of a hydroxyl group of the polyhydroxystyrene derivative of the formula shown above to a vinyl group of an ether compound of the following formula in the presence of an acid catalyst, thereby protecting some of hydroxyl groups of the polyhydroxystyrene (in an amount of p mol per mol of the entire hydroxyl group) with alkoxyalkyl groups.

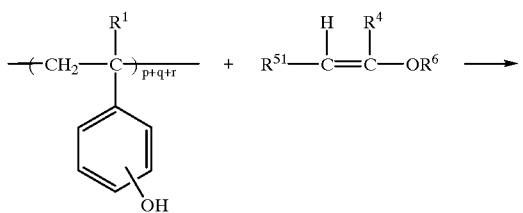

-continued

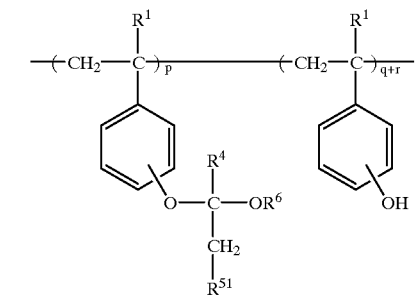

In the formulae, $R^1$, $R^4$, and $R^6$ are as previously defined, and $R^{51}$ is a hydrogen atom or normal or branched alkyl group of 1 to 5 carbon atoms.

The ether compounds used herein are vinyl ether, propenyl ether, and so forth. This reaction is preferably carried out in a solvent such as dimethylformamide, tetrahydrofuran, and dimethylacetamide. Exemplary acids are hydrochloric acid, sulfuric acid, p-toluenesulfonic acid, methanesulfonic acid, and pyridinium p-toluenesulfonate and they are preferably used in an amount of 0.1 to 10 mol % per mol of the entire hydroxyl group of the polyhydroxystyrene. The reaction temperature is preferably room temperature to 60° C. and the reaction time is generally about 1 to 20 hours.

Where some of hydroxyl groups of the polyhydroxystyrene are methoxymethylated, an alkali halide such as NaH and a halomethyl ether such as chloromethyl ether are preferably reacted with the polyhydroxystyrene in a solvent such as dimethylsulfoxide and tetrahydrofuran. In this case, the amount of alkali halide used is preferably determined such that methoxymethyl groups are introduced in an appropriate amount per mol of the entire hydroxyl groups of the polyhydroxystyrene. The reaction temperature is preferably 0 to 50° C. and the reaction time is generally about 1 to 20 hours.

After the alkoxyalkylation reaction, tert-butoxycarbonylation or tert-butoxycarbonylmethylation reaction is carried out for introducing an acid labile group $R^3$.

The tert-butoxycarbonyl-introducing reaction may be carried out by reacting the partially alkoxyalkylated polyhydroxystyrene with di-tert-butyl dicarbonate in a solvent such as pyridine and tetrahydrofuran. Di-tert-butyl dicarbonate is used herein in an amount to introduce q mol of tert-butoxycarbonyl group per mol of the entire hydroxyl groups of the polyhydroxystyrene. The reaction temperature is preferably room temperature to 50° C. and the reaction time is generally about ½ to 4 hours.

The tert-butoxycarbonylmethyl-introducing reaction may be carried out by reacting the partially alkoxyalkylated polyhydroxystyrene with potassium tert-butoxide and tert-butoxycarbonylmethyl bromide in a solvent such as dimethyl sulfoxide and tetrahydrofuran. Potassium tert-butoxide is used herein in an amount to introduce q mol of tert-butoxycarbonylmethyl group per mol of the entire hydroxyl groups of the polyhydroxystyrene. The amount of tert-butoxycarbonylmethyl bromide used is equimolar to the potassium tert-butoxide. The reaction temperature is preferably room temperature to 50° C. and the reaction time is generally about ⅓ to 10 hours.

Also, the tetrahydropyranyl-incorporating reaction may be carried out by reacting with dihydropyran in tetrahydrofuran. The tetrahydrofuranyl-incorporating reaction may be carried out by reacting with dihydrofuran in tetrahydrofuran.

Trialkylsilylation reaction may be carried out by reacting with a trialkylsilyl chloride in the presence of imidazole. The reaction temperature is preferably room temperature to 50° C. and the reaction time is generally about 1 to 5 hours.

Among these reactions, it is advantageous to introduce a tert-butoxycarbonyl or tert-butoxycarbonylmethyl group because a polymer of the following general formula can be produced thereby.

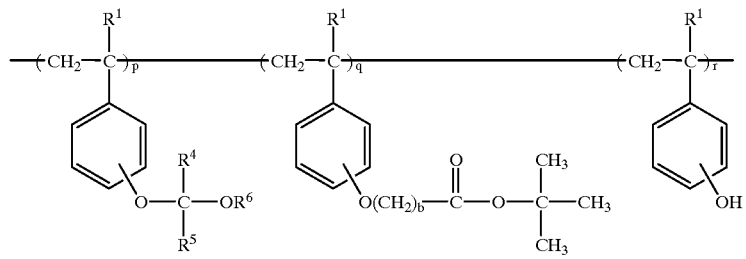

$R^1$, $R^4$ to $R^6$, p, q, r, and b are as previously defined.

The photoacid generator (C) used in the chemically amplified positive resist composition according to the invention may be selected, for example, from onium salts, sulfonate derivatives, and diazosulfonate derivatives. Since the base resin tends to have a low glass transition temperature (Tg) due to the presence of an alkoxyalkyl group therein, onium salts featuring efficient acid generation and significant dissolution inhibition effect are preferred in order to avoid such tendency. Several illustrative examples of the photoacid generator (C) are given below.

Onium salts include
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
(p-tert-butoxycarbonylmethoxyphenyl)diphenylsulfonium trifluoromethanesulfonate,
tris(p-tert-butoxycarbonylmethoxyphenyl)sulfonium trifluoromethanesulfonate,
bis(p-dimethylaminophenyl)(p-tert-butoxyyphenyl)sulfonium trifluoromethanesulfonate,
bis(p-tert-butoxyyphenyl)(p-dimethylaminophenyl)sulfonium trifluoromethanesulfonate,
(p-tert-butoxycarbonylmethoxyphenyl)diphenylsulfonium p-toluenesulfonate,
tris(p-tert-butoxycarbonylmethoxyphenyl)sulfonium p-toluenesulfonate,
bis(p-dimethylaminophenyl)(p-tert-butoxyphenyl)sulfonium p-toluenesulfonate,
bis(p-tert-butoxyphenyl)(p-dimethylaminophenyl)sulfonium p-toluenesulfonate,
(m-tert-butoxyphenyl)diphenylsulfonium p-toluenesulfonate,
bis(m-tert-butoxyphenyl)phenylsulfonium p-toluenesulfonate,
tris(m-tert-butoxyphenyl)sulfonium p-toluenesulfonate,
(m-tetrahydropyranyloxyphenyl)diphenylsulfonium p-toluenesulfonate,
bis(m-tetrahydropyranyloxyphenyl)phenylsulfonium p-toluenesulfonate,
tris(m-tetrahydropyranyloxyphenyl)sulfonium p-toluenesulfonate,
(p-tetrahydropyranyloxyphenyl)diphenylsulfonium p-toluenesulfonate,
bis(p-tetrahydropyranyloxyphenyl)phenylsulfonium p-toluenesulfonate,
tris(p-tetrahydropyranyloxyphenyl)sulfonium p-toluenesulfonate,
(p-tetrahydrofuranyloxyphenyl)diphenylsulfonium p-toluenesulfonate,
bis(p-tetrahydrofuranyloxyphenyl)phenylsulfonium p-toluenesulfonate,
tris(p-tetrahydrofuranyloxyphenyl)sulfonium p-toluenesulfonate,
(p-tert-butoxyphenyl)diphenylsulfonium pentafluorobenzenesulfonate,
bis(p-tert-butoxyphenyl)phenylsulfonium pentafluorobenzenesulfonate,
tris(p-tert-butoxyphenyl)sulfonium pentafluorobenzenesulfonate,
(p-tert-butoxyphenyl)diphenylsulfonium camphor-10-sulfonate, bis(p-tert-butoxyphenyl)phenylsulfonium camphor-10-sulfonate, and
tris(p-tert-butoxyphenyl)sulfonium camphor-10-sulfonate.

Other useful photoacid generators include β-ketosulfonate derivatives such as 2-cyclohexylcarbonyl-2-(p-toluenesulfonyl)propane and 2-isopropylcarbonyl-2-(p-toluenesulfonyl)propane; diazomethane derivatives such as bis(benzenesulfonyl)diazomethane, bis(cyclohexylsulfonyl)-diazomethane, and bis(tert-butylsulfonyl)diazomethane; disulfone derivatives such as diphenyl disulfone and dicyclohexyl disulfone; nitrobenzyl sulfonate derivatives such as 2,6-dinitrobenzyl p-toluenesulfonate and 2,4-dinitrobenzyl p-toluenesulfonate; sulfonate ester derivatives such as 1,2,3-tris(methanesulfonyloxy)benzene, 1,2,3-tris (trifluoromethanesulfonyloxy)benzene, and 1,2,3-tris(p-toluenesulfonyloxy)benzene; and imide-yl sulfonates such as phthalimide-yl triflate, phthalimide-yl tosylate, 5-norbornene-2,3-dicarboxyimide-yl triflate, 5-norbornene-2,3-dicarboxyimide-yl tosylate, and 5-norbornene-2,3-dicarboxyimide-yl n-butylsulfonate.

Preferred among others are triphenylsulfonium trifluoromethanesulfonate, (p-tert-butoxyphenyl) diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, tris(p-tert-butoxyphenyl)-sulfonium p-toluenesulfonate, (p-tert-butoxycarbonylmethoxy phenyl)diphenylsulfonium trifluoromethanesulfonate, bis(p-dimethylaminophenyl)(p-tert-butoxyphenyl)sulfonium trifluoromethanesulfonate, tris (m-tert-butoxyphenyl)sulfonium p-toluenesulfonate, tris(m-tetrahydropyranyloxyphenyl)-sulfonium p-toluenesulfonate, tris(p-tert-butoxyphenyl)-sulfonium pentafluorobenzenesulfonate, and (p-tert-butoxyphenyl) diphenylsulfonium camphor-10-sulfonate.

The photoacid generators may be used alone or in admixture of two or more.

Among the onium salts, those synthesized according to the following reaction scheme (i) or (ii) and purified are preferred since they overcome the problem of low shelf stability manifesting itself as sensitivity changes and particle generation. Since the procedure according to reaction scheme (i) or (ii) is direct synthesis in an alkaline reaction solution, the procedure avoids contamination with acidic impurities causing that problem. For this reason, those onium salts remain fully stable even after shelf storage over 6 months.

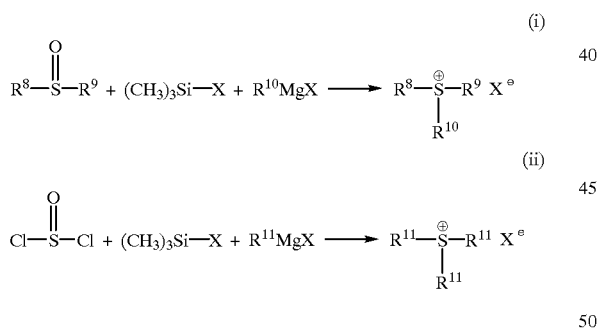

$R^8$, $R^9$, $R^{10}$, and $R^{11}$ are substituted or unsubstituted aromatic groups, and X is a sulfonate derivative.

Desirably, the photoacid generator is added in an amount of 1 to 20 parts, especially 2 to 10 parts by weight per 100 parts by weight of the base resin.

A dissolution rate regulator (D) is further blended in the chemically amplified positive resist composition of the present invention although it is not essential.

Included in dissolution rate regulator (D) are (D-1) a compound having a weight average molecular weight of 100 to 1,000, especially 150 to 800 and at least two phenolic hydroxyl groups in a molecule, the hydrogen atom of the phenolic hydroxyl group being replaced by an acid labile group in an overall average proportion of 10% to 100% and (D-2) a compound having a weight average molecular weight of more than 1,000 to 3,000 and a phenolic hydroxyl group in a molecule, the hydrogen atom of the phenolic hydroxyl group being partially replaced by an acid labile group in an overall average proportion of more than 0% to 60%.

Either dissolution rate regulator (D-1) or (D-2) may be used alone while a mixture of dissolution rate regulators (D-1) and (D-2) is also useful.

The compound having a weight average molecular weight of 100 to 1,000 and at least two phenolic hydroxyl groups in a molecule as dissolution rate regulator (D-1) is exemplified by compounds of the following general formulae (6) to (16):

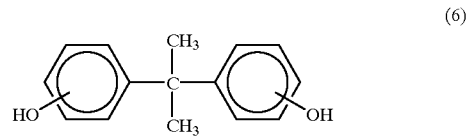

(6)

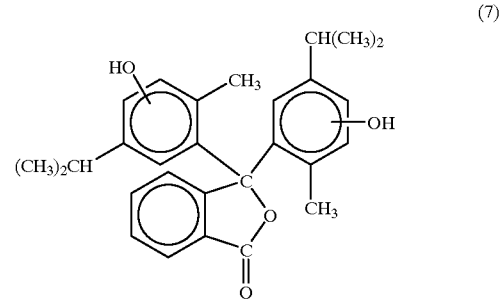

(7)

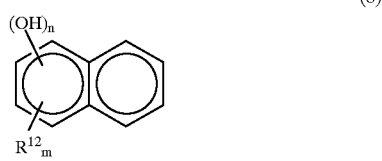

(8)

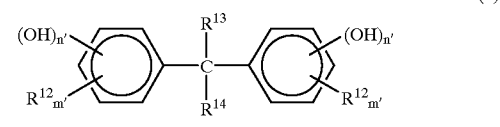

(9)

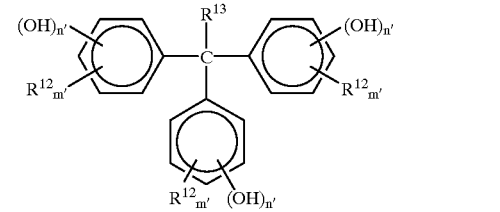

(10)

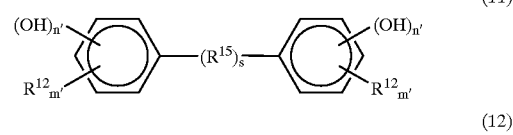

(11)

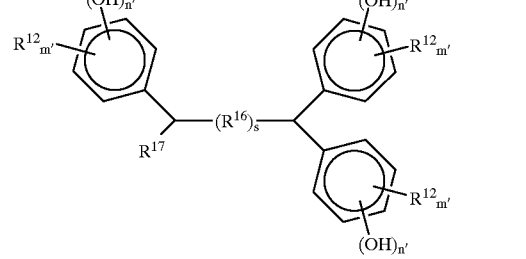

(12)

-continued

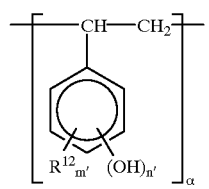
(13)

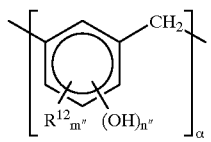
(14)

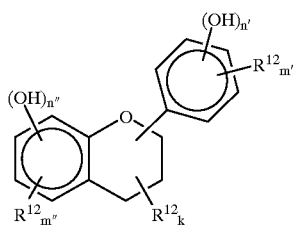
(15)

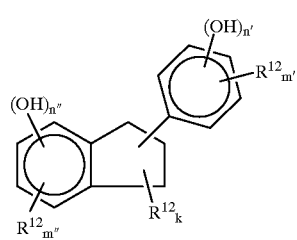
(16)

In the formulae, $R^{12}$ and $R^{13}$ are independently a hydrogen atom or normal or branched alkyl or alkenyl group having 1 to 8 carbon atoms, $R^{14}$ is a hydrogen atom, normal or branched alkyl or alkenyl group having 1 to 8 carbon atoms, or $(R^{18})_s$—COOH, $R^{15}$ is a group —$(CH_2)_t$— wherein t is 2 to 10, arylene group having 6 to 10 carbon atoms, carbonyl group, sulfonyl group, oxygen atom or sulfur atom, $R^{16}$ is an alkylene group having 1 to 10 carbon atoms, arylene group having 6 to 10 carbon atoms, carbonyl group, sulfonyl group, oxygen atom or sulfur atom, $R^{17}$ is a hydrogen atom, alkyl group having 1 to 8 carbon atoms, normal or branched alkenyl group, hydroxyl-substituted phenyl or naphthyl group, $R^{18}$ is a normal or branched alkylene group having 1 to 10 carbon atoms, letter k is an integer of 0 to 5, s is 0 or 1, m, n, m', n', m", and n" are numbers satisfying m+n=8, m'+n'=5, and m"+n"=4 such that at least one hydroxyl group is attached to each phenyl skeleton, and α is such a number that the compound of formula (13) or (14) may have a molecular weight of 100 to 1,000.

Exemplary groups represented by $R^{12}$ and $R^{13}$ are hydrogen, methyl, ethyl, butyl, propyl, ethynyl, and cyclohexyl groups. Exemplary groups represented by $R^{14}$ are those mentioned for $R^{12}$ and $R^{13}$, —COOH and —CH$_2$COOH. Exemplary groups represented by $R^{15}$ are ethylene, phenylene, carbonyl, and sulfonyl groups, oxygen and sulfur atoms. Exemplary groups represented by $R^{16}$ are a methylene group and those mentioned for $R^{15}$. Exemplary groups represented by $R^{17}$ are hydrogen, methyl, ethyl, butyl, propyl, ethynyl, cyclohexyl, hydroxyl-substituted phenyl and hydroxyl-substituted naphthyl groups.

The acid labile group in dissolution rate regulator (D-1) includes groups of formulae (2) and (3), tert-butyl, tetrahydropyranyl, tetrahydrofuranyl, trialkylsilyl, and β-ketoalkyl groups.

In dissolution rate regulator (D-1), the hydrogen atom of the phenolic hydroxyl group is (partially) replaced by an acid labile group. The degree of replacement of the hydrogen of phenolic hydroxyl group by an acid labile group is on average 10 to 100%, preferably 30 to 80% of the overall phenolic hydroxyl groups. A degree of substitution of less than 10% would cause edge roughness.

In dissolution rate regulator (D-2), the hydrogen atom of the phenolic hydroxyl group is partially replaced by an acid labile group. The degree of partial replacement of the hydrogen of phenolic hydroxyl group by an acid labile group is on average more than 0% to 60%, preferably more than 0% to 40% of the overall phenolic hydroxyl groups. No satisfactory dissolution control is achieved with a degree of substitution of 0% whereas a degree of substitution of more than 60% causes phase separation between polymers, that is, a loss of compatibility.

The compound having a weight average molecular weight of more than 1,000 to 3,000 and a phenolic hydroxyl group in a molecule as dissolution rate regulator (D-2) is exemplified by compounds having a recurring unit of the following general formula (17):

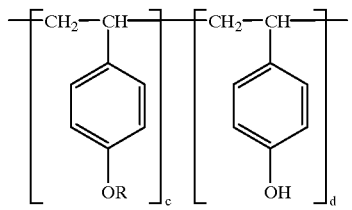
(17)

wherein R is an acid labile group, letters c and d are numbers satisfying $0 \leq c/(c+d)$ $c \leq 0.6$.

The acid labile group in dissolution rate regulator (D-2) includes alkoxyalkyl groups of formula (2), carbonyl-bearing groups of formula (3), tert-butyl, tetrahydropyranyl, trialkylsilyl, and β-ketoalkyl groups.

Understandably, like the base resin, dissolution rate regulators (D) as mentioned above can be synthesized by chemically reacting a compound having a phenolic hydroxyl group with an acid labile group.

The dissolution rate regulator is preferably blended in the resist composition in an amount of about 3 to 50 parts, more preferably about 3 to 30 parts by weight per 100 parts by weight of the base resin. On this basis, less than 3 parts of the dissolution rate regulator would be less effective for improving resolution whereas more than 50 parts of the dissolution rate regulator would result in thinning of pattern film and low resolution.

In the resist composition of the invention, a basic compound (E) is optionally blended. The basic compound is preferably a compound which can suppress the diffusion rate at which the acid generated from the photoacid generator diffuses into a resist coating. The blending of such a basic compound suppresses the diffusion rate of acid in a resist coating to improve resolution, suppresses a change of sensitivity after exposure, and mitigates substrate and environment dependency, achieving improvements in exposure margin and pattern profile. Included in the basic compound are primary, secondary and tertiary aliphatic amines, hybrid amines, aromatic amines, heterocyclic amines, carboxyl-bearing nitrogenous compounds, sulfonyl-bearing nitrogenous compounds, hydroxyl-bearing nitrogenous compounds, hydroxyphenyl-bearing nitrogenous compounds, alcoholic nitrogenous compounds, and amide derivatives.

Examples of the primary aliphatic amine include ammonia, methylamine, ethylamine, propylamine, butylamine, pentylamine, amylamine, hexylamine, heptylamine, octylamine, nonylamine, decylamine, laurylamine, cetylamine, methylenediamine, ethylenediamine, and tetraethylenediamine. Examples of the secondary aliphatic amine include dimethylamine, diethylamine, dipropylamine, dibutylamine, dipentylamine, dihexylamine, diheptylamine, dioctylamine, dinonylamine, didecylamine, dimethylmethylenediamine, dimethylethylenediamine, and dimethyltetraethylenediamine. Examples of the tertiary aliphatic amine include trimethylamine, triethylamine, tripropylamine, tributylamine, tripentylamine, trihexylamine, triheptylamine, trioctylamine, tetramethylmethylenediamine, tetramethylethylenediamine, and tetramethyltetraethylenediamine.

Examples of the hybrid amine include dimethylethylamine and methylethylpropylamine. Examples of the aromatic and heterocyclic amines include benzylamine, phenethylamine, benzyldimethylamine, aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 4-nitroaniline, and dinitroaniline), toluidine derivatives (e.g., toluidine and N,N-dimethyltoluidine), quinoline, aminobenzoic acid, N-phenylphenyltolylamine, N-methyldiphenylamine, triphenylamine, phenylenediamine, naphthylamine, diaminonaphthalene, pyrrole derivatives (e.g., pyrrole, methylpyrrole, dimethylpyrrole, and N-methylpyrrole), imidazole derivatives (e.g., imidazole, 4-methylimidazole, and 4-methyl-2-phenylimidazole), oxazole derivatives, thiazole derivatives, pyrazole derivatives, pyrrolidine derivatives (e.g., pyrrolidine, N-methylpyrrolidone and N-methylpyrrolidine), pyrroline derivatives, pyridine derivatives (e.g., pyridine, methylpyridine, ethylpyridine, propylpyridine, butylpyridine, 5-butyl-2-methylpyridine, trimethylpyridine, triethylpyridine, phenylpyridine, 3-methyl-2-phenylpyridine, tert-butylpyridine, diphenylpyridine, benzylpyridine, methoxypyridine, butoxypyridine, dimethoxypyridine, 1-methyl-2-pyridone, 4-pyrrolidinylpyridine, 1-methyl-4-phenylpyridine, 2-(1-ethylpropyl)pyridine, etc.), piperidine derivatives, pyrimidine derivatives, purine derivatives, quinoline derivatives, carbazole derivatives, indole derivatives, nicotinic amide derivatives, adenosine derivatives, adenine derivatives, thiabenzole, and diaminosulfone.

Examples of the carboxyl-bearing nitrogenous compound include amino acid derivatives such as nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine. Examples of the sulfonyl-bearing nitrogenous compound, hydroxyl-bearing nitrogenous compound, hydroxyphenyl-bearing nitrogenous compound, and alcoholic nitrogenous compound include 2-hydroxypyridine, aminocresole, thiaminenaphthalene disulfonic salts, pyridinesulfonic acid, ethanolamine, diethanolamine, triethanolamine, diisopropylamine, triisopropylamine, tripropylamine, 1-aminobutane-2-diol, 1-aminopropan-3-ol, and 1-aminobutane-2-diol. Examples of the amide derivative include formamide, N-methylformamide, N,N-dimethylformamide, acetamide, N-methylacetamide, N,N-dimethylacetamide, propionamide, and benzamide.

Preferably the basic compound is blended in an amount of 0.001 to 10 parts, especially 0.01 to 1 part by weight per part by weight of the photoacid generator. Less than 0.001 part would be ineffective whereas more than 10 parts of the basic compound would adversely affect resolution and sensitivity.

The resist composition of the invention may further contain various additives, for example, a surface-active agent for facilitating coating and a light-absorbing agent for reducing irregular reflection from the substrate. The amounts of such optional additives blended are conventional insofar as the objects of the invention are not impaired. Examples of the surfactant include perfluoroalkylpolyoxyethylene ethanols, fluorinated alkyl esters, perfluoroalkylamine oxides, and perfluoroalkyl EO addition products. Examples of the light-absorbing agent include diaryl sulfoxides, diaryl sulfones, 9,10-dimethylanthracene, and 9-fluorenone.

Any well-known lithography may be used to form a resist pattern from a positive resist composition of the invention. For example, the resist composition is spin coated onto a silicon wafer, prebaked at 80 to 120° C. to form a resist film of 0.5 to 2.0 μm thick, exposed to actinic radiation such as deep-UV, electron beam, and X-ray, and baked at 70 to 120° C. for 30 to 200 seconds (post-exposure baking=PEB), and developed with an aqueous base solution. The resist composition of the invention is especially suitable for fine patterning with deep-UV radiation of 254 to 193 nm and electron beams.

There has been described a chemically amplified positive resist composition which is highly sensitive to actinic radiation such as deep-ultraviolet radiation, electron beam and X-ray, especially KrF excimer laser light, has improved sensitivity, resolution and plasma etching resistance. The resulting resist pattern is fully resistant to heat. The resist pattern is improved in dimension control since it is unlikely to overhang. Owing to these characteristics, the resist composition of the invention has minimal absorption at the exposure wavelength of a KrF excimer laser. Because of its high resolution and ability to form a fine pattern having a perpendicular wall to the substrate, the resist composition is suitable for use in fine patterning for the fabrication of ultra-LSIs.

EXAMPLE

Examples of the present invention are given below by way of illustration and not by way of limitation. All parts are by weight.

Synthesis Example 1

A 2-liter flask was charged with 0.5 gram of lauryl peroxide, 10 grams of p-tert-butoxycarbonyloxystyrene, 28 grams of p-1-ethoxyethoxystyrene, 62 grams of p-vinylphenol, and 1,000 ml of acetone. The flask was purged with nitrogen. The mixture was heated at 90° C. for 5 hours for polymerization reaction. At the end of polymerization reaction, the reaction product was washed with methanol and dried, obtaining 90 grams of a powder solid. This powder solid was a polymer of the rational formula shown below as "Poly 1" and the yield was 90%. This polymer had a weight average molecular weight (Mw) and dispersity (Mw/Mn) as shown in Table 1. On proton-NMR analysis, a peak attributable to methylene originating from the alkoxyalkyl group was observed at 5.3 ppm and a peak attributable to a t-BOC group was observed at 1.5 ppm. Table 1 also shows the compositional ratio of p-1-ethoxyethoxystyrene unit (p), p-tert-butoxycarbonyloxystyrene unit (q), and p-vinylphenol unit (r) as calculated from an integration ratio of proton-NMR.

Synthesis Examples 2 and 3

Polymers designated "Poly 2" and "Poly 3" were obtained by the same procedure as Synthesis Example 1 except that p-1-methoxyethoxystyrene (Synthesis Example 2) or p-1-n-butoxyethoxystyrene (Synthesis Example 3) was used instead of the p-1-ethoxyethoxystyrene.

The resulting polymers had a structure as shown by the rational formulae shown below as "Poly 2" and "Poly 3," respectively. Their weight average molecular weight (Mw) and dispersity (Mw/Mn) are shown in Table 1.

Synthesis Example 4
Synthesis of monodisperse poly(p-1-ethoxyethoxystyrene-p-tert-butoxycarbonyloxystyrene-p-hydroxystyrene)

A 2-liter flask was charged with 700 ml of ho tetrahydrofuran as a solvent and $7 \times 10^{-3}$ mol of sec-butyl lithium as an initiator. 100 grams of p-tert-butoxystyrene was added to the flask contents at $-78°$ C., which was agitated for 1 hour for polymerization. The reaction solution was red. Polymerization was stopped by adding methanol to the reaction solution.

The reaction solution was then poured into methanol whereupon the reaction product precipitated. The precipitate was separated and dried, obtaining 99 grams of a white polymer which was poly(p-tert-butoxystyrene). The polymer had a number average molecular weight of $1.4 \times 10^4$ g/mol as measured by membrane osmometry. A GPC elution curve indicative of a molecular weight dispersity showed that the polymer was highly monodisperse, that is, Mw/Mn= 1.07.

In 900 ml of acetone was dissolved 90 grams of the thus obtained poly(p-tert-butoxystyrene). A small amount of conc. sulfuric acid was added to the solution at 60° C., which was agitated for 7 hours. The reaction solution was poured into water whereupon the polymer precipitated. The precipitate was washed and dried, obtaining 60 grams of a polymer. The polymer had a number average molecular weight of $1.0 \times 10^4$ g/mol. Since no peak attributable to a tert-butyl group was observed on proton-NMR analysis, the polymer was polyhydroxystyrene having a narrow molecular weight dispersity.

In 1000 ml of dimethylformamide was dissolved 100 grams of the thus obtained polyhydroxystyrene. A catalytic amount of pyridinium p-toluenesulfonate was added. With stirring at 30° C., 30 grams of ethyl vinyl ether was added. Reaction was continued for 16 hours. After the reaction solution was neutralized with conc. aqueous ammonia, the neutralized reaction solution was added dropwise to 10 liters of water, obtaining a white solid. The solid was collected by filtration, dissolved in 500 ml of acetone, and added dropwise to 10 liters of water. The product was collected by filtration and dried in vacuum. On proton-NMR analysis, the polymer was found to be a polyhydroxystyrene wherein 27% of the hydrogen atom of hydroxyl group was ethoxyethylated.

In 500 ml of pyridine was dissolved 50 grams of the partially ethoxyethylated polyhydroxystyrene. With stirring at 45° C., 7 grams of di-tert-butyl dicarbonate was added to the solution. After 1 hour of reaction, the reaction solution was added dropwise to 3 liters of water whereupon a white solid precipitated. After filtration, the solid was dissolved in 50 ml of acetone and added dropwise to 2 liters of water. After filtration, the precipitate was dried in vacuum, obtaining a polymer. This polymer designated "Poly 4" had an ethoxyethyl introduction of the hydrogen atom of hydroxyl group of 27% and a t-BOC introduction of the hydrogen atom of hydroxyl group of 8% as calculated from proton-NMR, a weight average molecular weight (Mw) and dispersity (Mw/Mn) as shown in Table 1, and a GPC elution curve as shown in FIG. 1.

Synthesis Example 5
Synthesis of monodisperse poly(p-1-ethoxypropoxystyrene-p-tert-butoxycarbonyloxystyrene-p-hydroxystyrene)

A polyhydroxystyrene obtained as in Example 4, 50 grams, was dissolved in 500 ml of dimethylformamide. A catalytic amount of pyridinium p-toluenesulfonate was added. With stirring at 40° C., 27 grams of ethoxypropenyl was added. Reaction was continued for 12 hours. After the reaction solution was neutralized with conc. aqueous ammonia, the neutralized reaction solution was added dropwise to 10 liters of water, obtaining a white solid. The solid was collected by filtration, dissolved in 500 ml of acetone, and added dropwise to 10 liters of water. The polymer was collected by filtration and dried in vacuum. On proton-NMR analysis, the polymer was found to be a polyhydroxystyrene wherein 24% of the hydrogen atom of hydroxyl group was replaced by ethoxypropyl.

In 500 ml of pyridine was dissolved 50 grams of the partially ethoxypropoxylated polyhydroxystyrene. With stirring at 45° C., 8 grams of di-tert-butyl dicarbonate was added to the solution. After 1 hour of reaction, the reaction solution was added dropwise to 3 liters of water whereupon a white solid precipitated. After filtration, the solid was dissolved in 50 ml of acetone and added dropwise to 2 liters of water. After filtration, the precipitate was dried in vacuum, obtaining a polymer. This polymer had a structure shown by the rational formula given below as "Poly 5." The polymer had an ethoxypropyl introduction of the hydrogen atom of hydroxyl group of 24% and a t-BOC introduction of the hydrogen atom of hydroxyl group of 11% as calculated from proton-NMR, a weight average molecular weight (Mw) and dispersity (Mw/Mn) as shown in Table 1.

Synthesis Examples 6–16

Polymers designated "Poly 6" to "Poly 16" were by obtained the same procedure as Synthesis Examples 4 and 5.

The resulting polymers had a structure as shown by the rational formulae shown below as "Poly 6", to "Poly 16," respectively. Their weight average molecular weight (Mw) and dispersity (Mw/Mn) are shown in Table 1.

TABLE 1
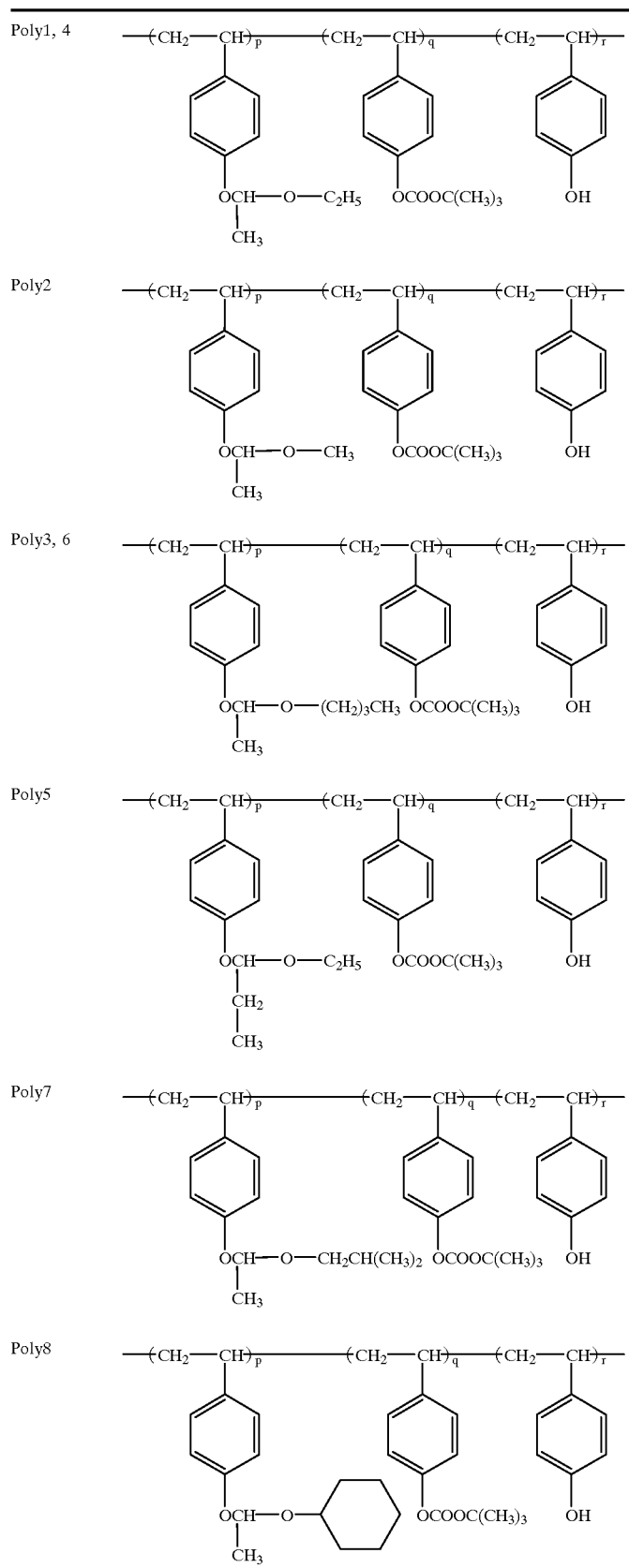

TABLE 1-continued
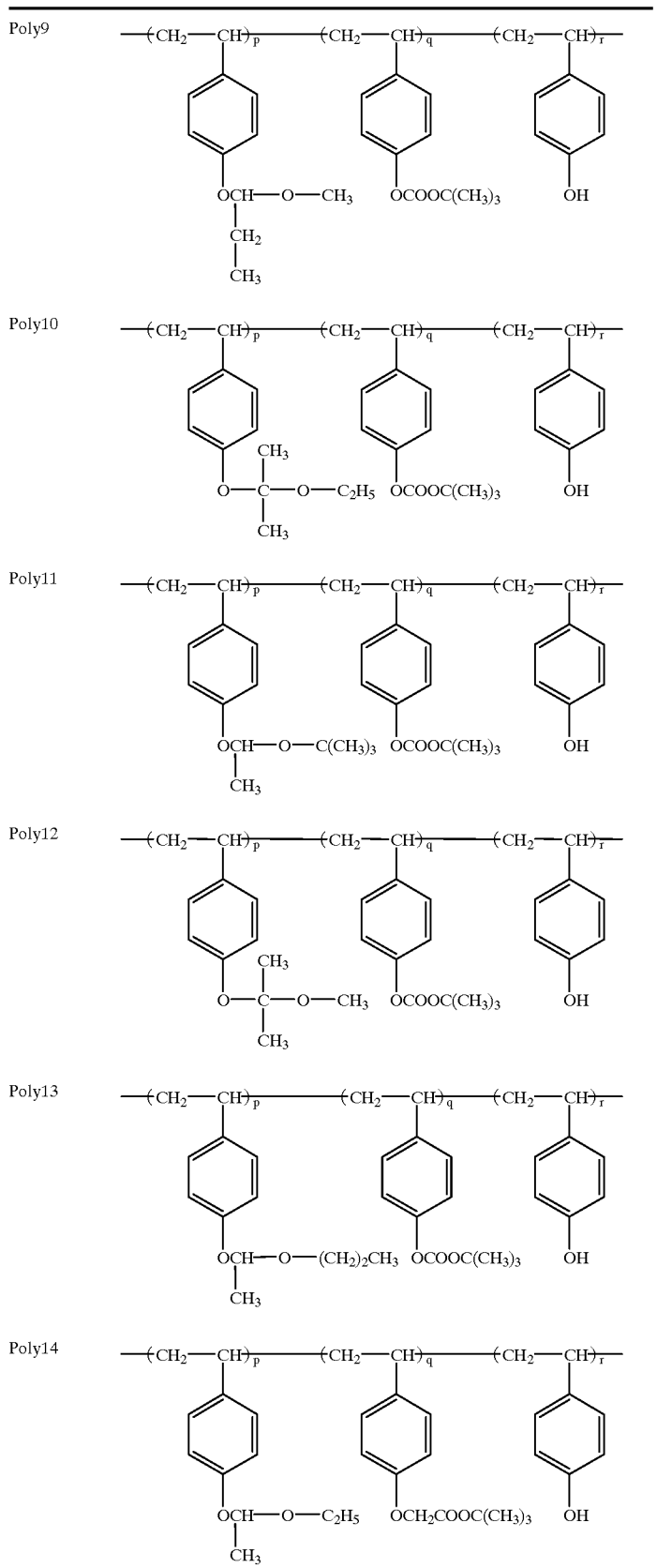

TABLE 1-continued

Poly15 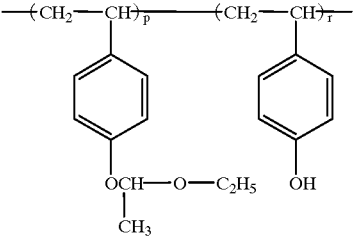

Poly16 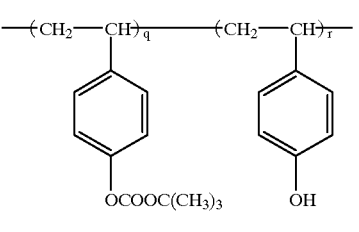

| Synthesis Example | Compositional ratio | | | Mw | Dispersity Mw/Mn |
|---|---|---|---|---|---|
| | p | q | r | | |
| 1 (Poly1) | 0.27 | 0.06 | 0.67 | 11000 | 2.25 |
| 2 (Poly2) | 0.30 | 0.10 | 0.60 | 13500 | 2.10 |
| 3 (Poly3) | 0.23 | 0.17 | 0.60 | 10500 | 1.96 |
| 4 (Poly4) | 0.27 | 0.08 | 0.65 | 11500 | 1.08 |
| 5 (Poly5) | 0.24 | 0.11 | 0.65 | 12000 | 1.08 |
| 6 (Poly6) | 0.25 | 0.15 | 0.60 | 13500 | 1.10 |
| 7 (Poly7) | 0.23 | 0.08 | 0.69 | 11500 | 1.08 |
| 8 (Poly8) | 0.20 | 0.07 | 0.73 | 13600 | 1.10 |
| 9 (Poly9) | 0.25 | 0.15 | 0.60 | 13500 | 1.10 |
| 10 (Poly10) | 0.29 | 0.10 | 0.61 | 11300 | 1.09 |
| 11 (Poly11) | 0.24 | 0.10 | 0.66 | 12000 | 1.08 |
| 12 (Poly12) | 0.25 | 0.15 | 0.60 | 13500 | 1.10 |
| 13 (Poly13) | 0.19 | 0.10 | 0.71 | 12500 | 1.08 |
| 14 (Poly14) | 0.25 | 0.10 | 0.65 | 12300 | 1.08 |
| 15 (Poly15) | 0.38 | — | 0.62 | 10500 | 1.09 |
| 16 (Poly16) | — | 0.15 | 0.85 | 10300 | 1.08 |

Examples 1–34 & Comparative Examples 1–4

Liquid resist compositions were prepared by dissolving a base resin, a photoacid generator, a dissolution rate regulator, and a basic compound in a solvent in accordance with the formulation shown in Tables 2 to 4. Each of the compositions was passed through a 0.2 μm Teflon® filter.

The base resins used were polymers synthesized in Synthesis Examples, designated Poly 1 to 14. For comparison purpose, polymers designated Poly 15 and Poly 16 were also used as the base resin.

The photoacid generators used were PAG1 to PAG8 shown below.

The dissolution rate regulators used were compounds designated DRR1 to DRR14.

The basic compounds used were shown in Tables 2 to 4.

The solvents used were diethylene glycol dimethyl ether (DGLM), ethyl lactate (EL)/butyl acetate (BA), propylene glycol monomethyl acetate (PGMMA), and propylene glycol monoethyl acetate (PGMEA).

Each liquid resist composition was then spin coated onto is a silicon wafer to form a coating of 0.8 μm thick. With the silicon wafer rested on a hot plate at 100° C., the coating was pre-baked for 120 seconds. The film was exposed to a pattern of light by means of an excimer laser stepper model NSR-2005EX8A (manufactured by Nikon K.K., numerical aperture NA=0.5), baked at 90° C. for 60 seconds, and developed with an aqueous solution of 2.38% tetramethylammonium hydroxide, obtaining a positive pattern.

The resulting resist pattern was evaluated as follows. First, a sensitivity (Eth value) was determined. Provided that the exposure quantity with which the top and bottom of a 0.35-μm line-and-space pattern were resolved at 1:1 was the optimum exposure (sensitivity Eop), the minimum line width of a line-and-space pattern which was recognized separate at this exposure was the resolution of a test resist. The configuration of the resist pattern resolved was observed under a scanning electron microscope. The edge roughness of a 0.25 μm line-and-space pattern was also observed under a scanning electron microscope.

The results are shown in Tables 2 to 4.

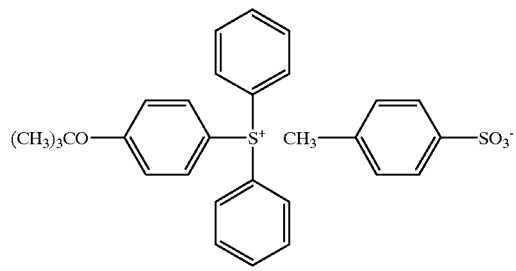
PAG1
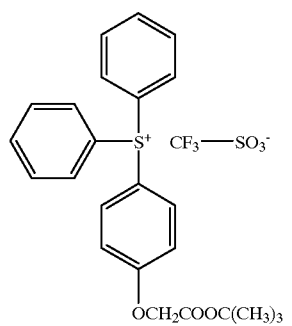
PAG2
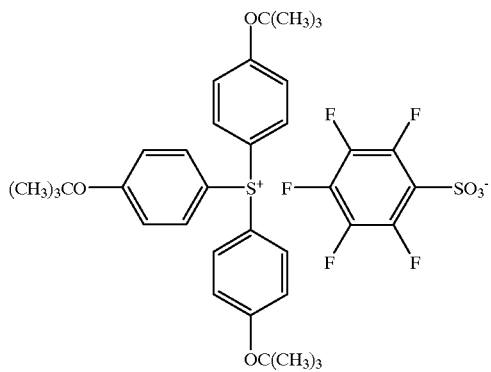
PAG3
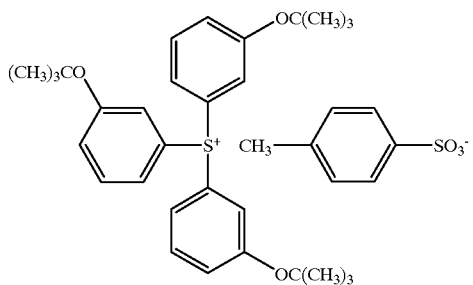
PAG4

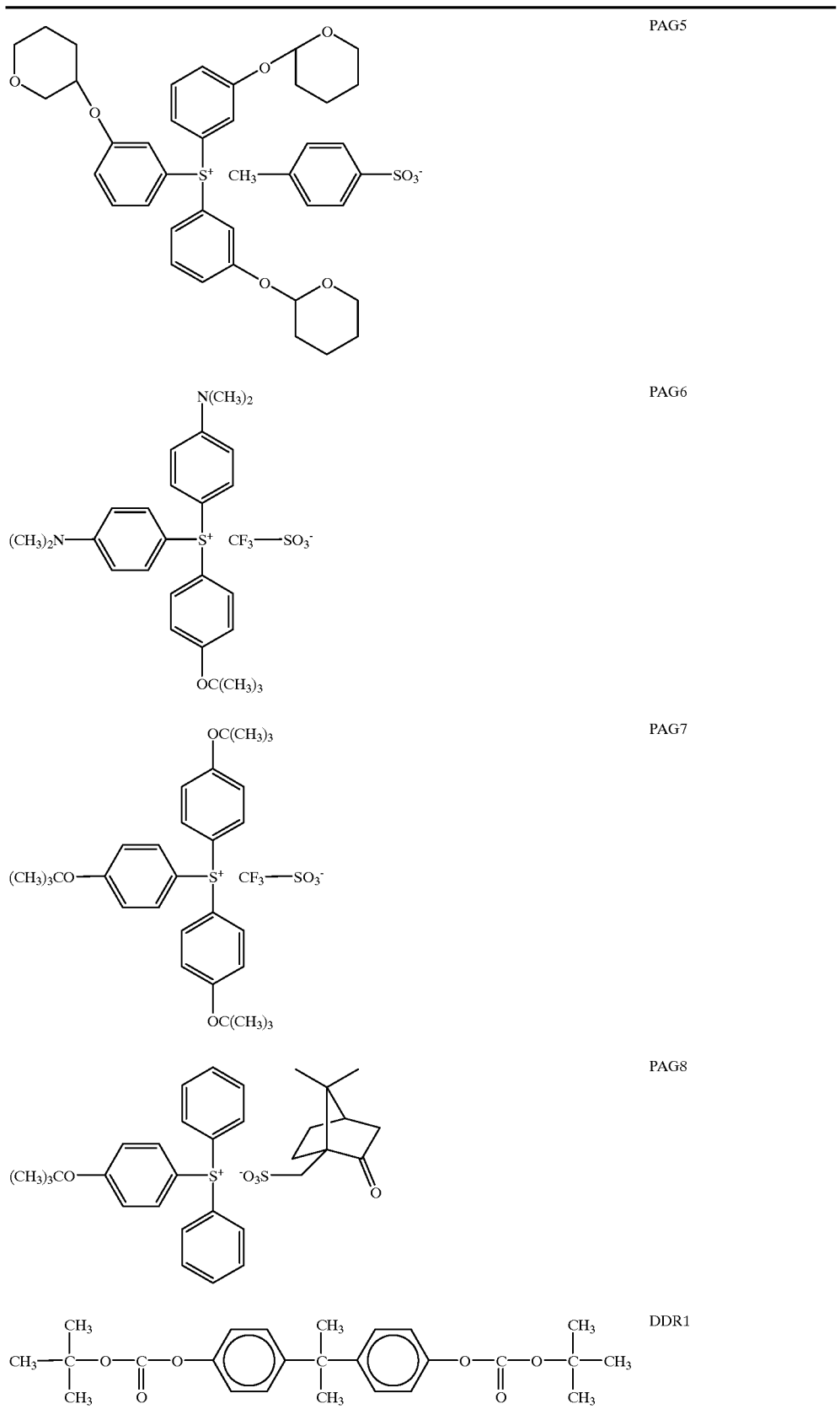

-continued

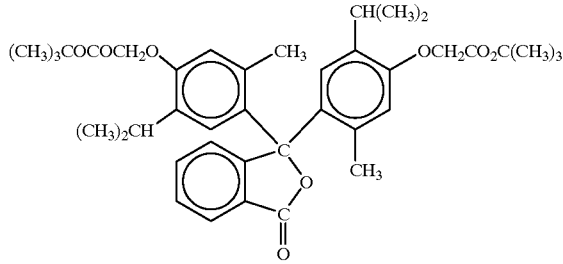

DRR2

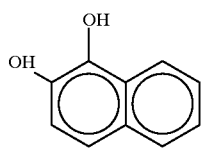

DRR3
Acid labile group:
tert-butoxycarbonyl group
Average substitution 50%

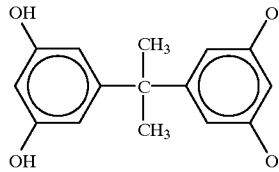

DRR4
Acid labile group:
tert-butoxycarbonyl group
Average substitution 75%

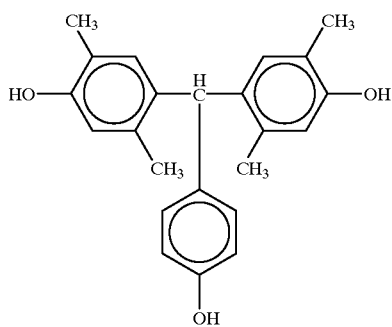

DRR5
Acid labile group:
tert-butyl group
Average substitution 33%

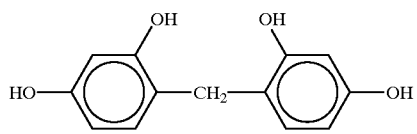

DRR6
Acid labile group:
tert-butoxycarbonyl group
Average substitution 50%

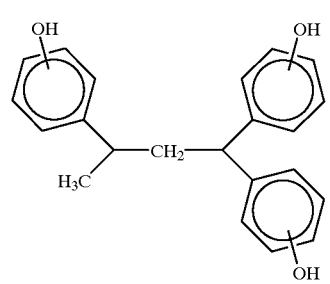

DRR7
Acid labile group:
tetrahydropyranyl group
Average substitution 66%

-continued

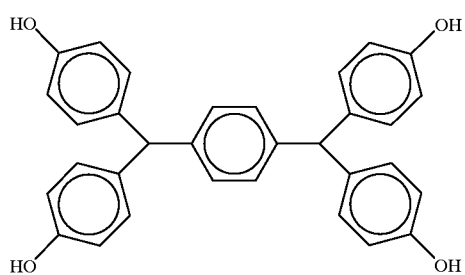

DRR8
Acid labile group:
tert-butoxycarbonyl group
Average substitution 50%

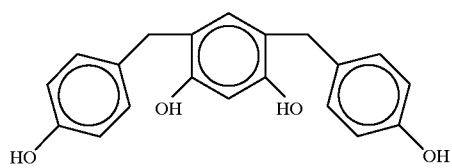

DRR9
Acid labile group:
ethoxyethyl group
Average substitution 50%

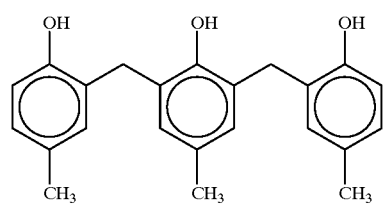

DRR10
Acid labile group:
tert-butoxycarbonyl group
Average substitution 33%

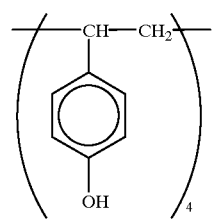

DRR11
Acid labile group:
tert-butoxycarbonyl group
Average substitution 50%

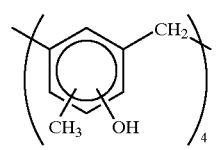

DRR12
Acid labile group:
tert-butoxycarbonyl group
Average substitution 50%

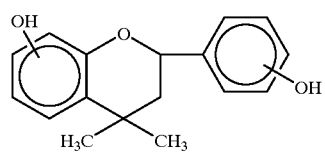

DRR13
Acid labile group:
tert-butoxycarbonyl group
Average substitution 50%

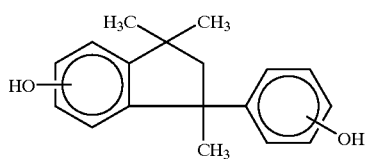

DRR14
Acid labile group:
tert-butoxycarbonyl group
Average substitution 50%

TABLE 2

| | | Resist composition (pbw in parentheses) | | | | | | |
|---|---|---|---|---|---|---|---|---|
| Example | Base resin | Photoacid generator | Dissolution rate regulator | Basic compound | Solvent | Sensitivity Eop (mJ/cm$^2$) | Resolution (μm) | Edge roughness (nm) |
| 1 | Poly1 (80) | PAG1 (4) | — | — | PGMEA (300) | 12 | 0.24 | 10 |
| 2 | Poly2 (80) | PAG2 (4) | DRR2 (16) | — | PGMEA (300) | 20 | 0.24 | 10 |
| 3 | Poly3 (80) | PAG7 (4) | — | — | PGMEA (300) | 4 | 0.24 | 12 |
| 4 | Poly4 (80) | PAG1 (4) | — | — | PGMEA (300) | 4 | 0.22 | 10 |
| 5 | Poly5 (80) | PAG2 (4) | — | — | PGMEA (300) | 4 | 0.22 | 12 |
| 6 | Poly6 (80) | PAG7 (4) | — | — | DGLM (300) | 8 | 0.22 | 12 |
| 7 | Poly7 (80) | PAG1 (4) | DRR2 (16) | — | EL/BA (300) | 20 | 0.22 | 12 |
| 8 | Poly8 (80) | PAG2 (4) | DRR3 (16) | — | PGMEA (300) | 20 | 0.22 | 12 |
| 9 | Poly9 (80) | PAG7 (4) | DRR4 (16) | — | DGLM (300) | 8 | 0.22 | 10 |
| 10 | Poly10 (80) | PAG1 (4) | DRR5 (16) | — | DGLM (300) | 20 | 0.22 | 7 |
| 11 | Poly11 (80) | PAG8 (4) | DRR11 (16) | — | DGLM (300) | 15 | 0.22 | 7 |
| 12 | Poly12 (80) | PAG1 (4) | DRR6 (16) | — | DGLM (300) | 15 | 0.22 | 8 |
| 13 | Poly13 (80) | PAG1 (4) | DRR7 (16) | — | DGLM (300) | 8 | 0.22 | 7 |
| 14 | Poly14 (80) | PAG2 (4) | DRR8 (16) | — | DGLM (300) | 30 | 0.22 | 7 |
| 15 | Poly4 (80) | PAG4 (4) | DRR9 (16) | — | DGLM (300) | 10 | 0.22 | 7 |
| 16 | Poly4 (80) | PAG5 (4) | DRR10 (16) | — | DGLM (300) | 20 | 0.22 | 7 |
| 17 | Poly4 (80) | PAG6 (0.5) PAG1 (3.5) | DRR12 (16) | — | DGLM (300) | 15 | 0.22 | 7 |
| 18 | Poly5 (80) | PAG7 (4) | DRR13 (16) | — | DGLM (300) | 8 | 0.22 | 8 |
| 19 | Poly5 (80) | PAG8 (4) | DRR14 (16) | — | PGMMA (300) | 10 | 0.22 | 8 |
| 20 | Poly5 (80) | PAG2 (4) | DRR1 (16) DRR12 (4) | — | PGMMA (300) | 10 | 0.22 | 8 |

TABLE 3

| | | Resist composition (pbw in parentheses) | | | | | | |
|---|---|---|---|---|---|---|---|---|
| Example | Base resin | Photoacid generator | Dissolution rate regulator | Basic compound | Solvent | Sensitivity Eop (mJ/cm$^2$) | Resolution (μm) | Edge roughness (nm) |
| 21 | Poly4 (80) | PAG1 (4) | DRR2 (16) | tetraethylene-diamine (0.2) | PGMEA (300) | 28 | 0.22 | 8 |
| 22 | Poly4 (80) | PAG1 (4) | DRR2 (16) | dimethyl-ethylene-diamine (0.2) | PGMEA (300) | 20 | 0.22 | 8 |
| 23 | Poly6 (80) | PAG4 (4) | DRR1 (8) DRR5 (8) | tetramethyl-ethylene-diamine (0.2) | PGMEA (300) | 20 | 0.22 | 6 |
| 24 | Poly4 (80) | PAG3 (4) | DRR2 (8) DRR6 (8) | methylethyl-propylamine (0.2) | PGMEA (300) | 25 | 0.22 | 8 |
| 25 | Poly4 (80) | PAG1 (4) | DRR2 (16) | aniline (0.2) | PGMEA (300) | 14 | 0.22 | 7 |

TABLE 3-continued

| | | | Resist composition (pbw in parentheses) | | | | |
|---|---|---|---|---|---|---|---|
| Example | Base resin | Photoacid generator | Dissolution rate regulator | Basic compound | Solvent | Sensitivity Eop (mJ/cm$^2$) | Resolution ($\mu$m) | Edge roughness (nm) |
| 26 | Poly4 (80) | PAG1 (4) | DRR2 (16) | piperidine (0.2) | PGMEA (300) | 25 | 0.22 | 8 |
| 27 | Poly4 (80) | PAG1 (4) | DRR2 (8) DRR7 (8) | N-methyl-pyrrolidone (0.2) | PGMEA (300) | 12 | 0.22 | 7 |
| 28 | Poly14 (80) | PAG1 (3.5) PAG6 (0.5) | DRR2 (16) | purine (0.2) | PGMEA (300) | 20 | 0.22 | 6 |
| 29 | Poly4 (80) | PAG1 (4) | DRR2 (16) | alanine (0.2) | PGMEA (300) | 20 | 0.22 | 9 |
| 30 | Poly4 (80) | PAG1 (4) | DRR2 (16) | pyridine-sulfonic acid (0.2) | PGMEA (300) | 18 | 0.22 | 6 |
| 31 | Poly4 (80) | PAG1 (4) | DRR1 (16) | 2-hydroxy-pyridine (0.2) | PGMEA (300) | 15 | 0.22 | 6 |
| 32 | Poly4 (80) | PAG3 (4) | DRR2 (16) | 2-amino-p-cresole (0.2) | PGMEA (300) | 15 | 0.22 | 7 |
| 33 | Poly4 (80) | PAG1 (4) | — | triethanol-amine (0.2) | PGMEA (300) | 15 | 0.20 | 8 |
| 34 | Poly4 (80) | PAG1 (4) | DRR2 (8) DRR13 (8) | N,N-dimethyl-acetamide (0.2) | PGMEA (300) | 20 | 0.22 | 8 |

TABLE 4

| | | | Resist composition (pbw in parentheses) | | | | |
|---|---|---|---|---|---|---|---|
| Comparative Example | Base resin | Photoacid generator | Dissolution rate regulator | Basic compound | Solvent | Sensitivity Eop (mJ/cm$^2$) | Resolution ($\mu$m) | Edge roughness (nm) |
| 1 | Poly15 (80) | PAG1 (4) | — | — | DGLM (300) | 20 | 0.28 | 20 |
| 2 | Poly15 (80) | PAG2 (4) | DRR1 (16) | — | DGLM (300) | 28 | 0.28 | 15 |
| 3 | Poly16 (80) | PAG1 (4) | — | — | DGLM (300) | 12 | 0.26 | 22 |
| 4 | Poly16 (80) | PAG2 (4) | DRR1 (16) | — | DGLM (300) | 28 | 0.26 | 18 |

It is evident that chemically amplified positive resist compositions within the scope of the invention have high resolution and afford patterned resist films with minimized edge roughness.

Examples 35–69

Liquid resist compositions were prepared by dissolving a base resin, a photoacid generator, a dissolution rate regulator, and a basic compound in a solvent in accordance with the formulation shown in Tables 5 and 6. Each of the compositions was passed through a 0.2-$\mu$m Teflon® filter.

The base resins used were polymers synthesized in Synthesis Examples, designated Poly 1 to 14.

The photoacid generators used were PAG1 to PAG8 (shown above).

The dissolution rate regulators used were compounds designated DRR1 to DRR14 (shown above) and compounds designated DRR1' to DRR8' (shown below) which were obtained by chemically reacting a compound having a phenolic hydroxyl group with an acid labile group like the base resin.

The basic compounds used were shown in Tables 5 and 6.

The solvents used were diethylene glycol dimethyl ether (DGLM), ethyl lactate (EL)/butyl acetate (BA), propylene glycol monomethyl acetate (PGMMA), and propylene glycol monoethyl acetate (PGMEA).

The resulting resist compositions were applied and evaluated as in Example 1. The results are shown in Tables 5 and 6.

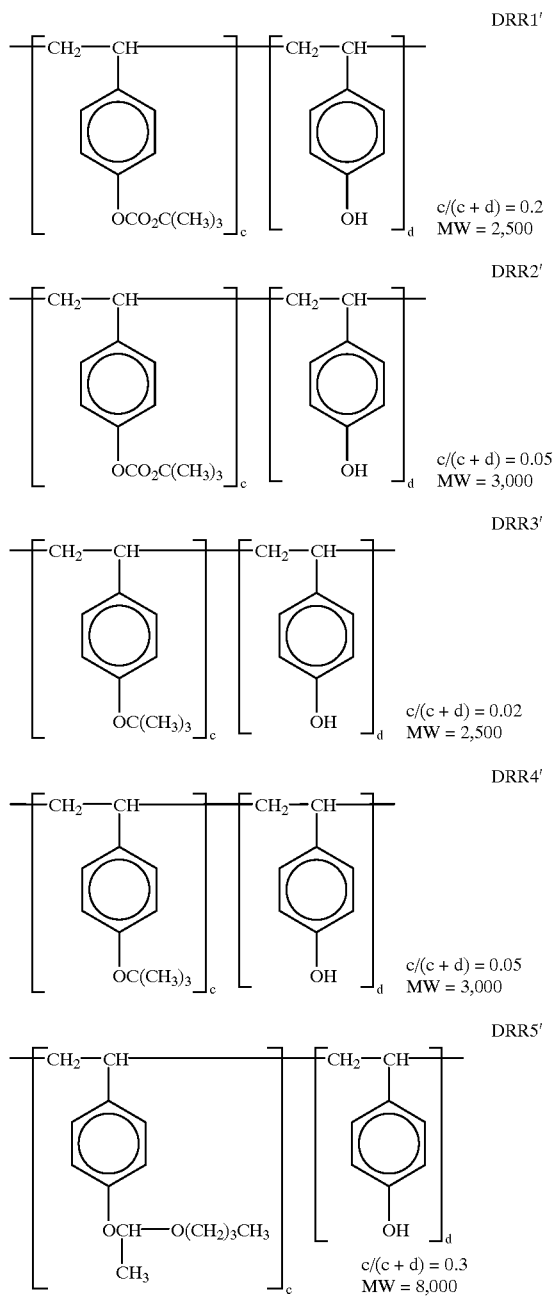
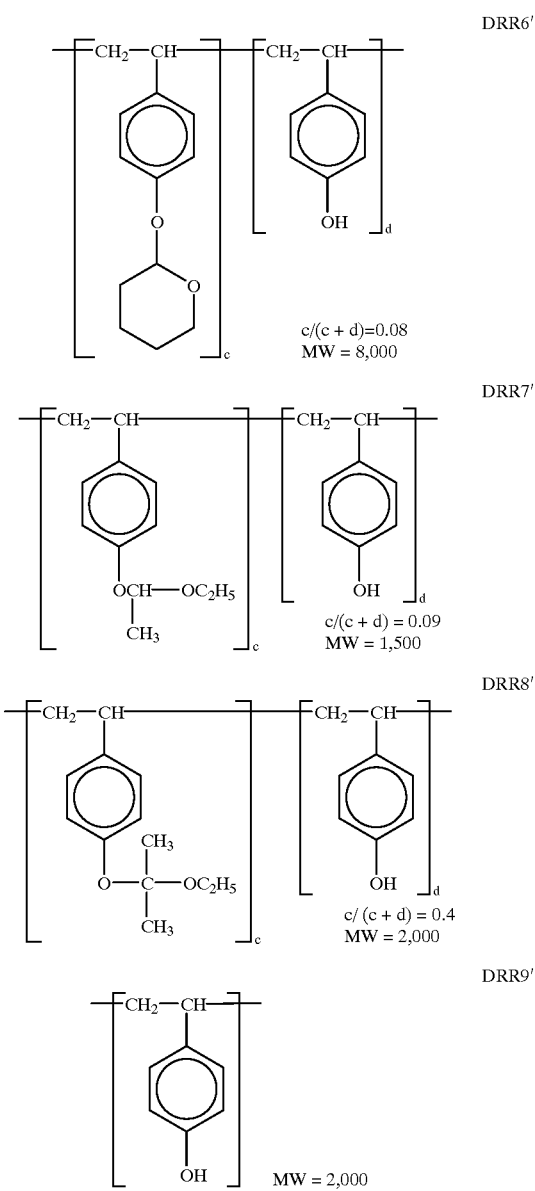
TABLE 5
| | | | | | | | | Edge |
| | Base | Photoacid | Dissolution rate | Basic | | Sensitivity Eop | Resolution | roughness |
| Example | resin | generator | regulator | compound | Solvent | (mJ/cm$^2$) | (μm) | (nm) |
|---|---|---|---|---|---|---|---|---|
| 35 | Poly1 (80) | PAG1 (4) | DRR1' (4) | — | — PGMEA (300) | 10 | 0.24 | 5 |
| 36 | Poly2 (80) | PAG2 (4) | DRR2' (4) | DRR1 (16) | — PGMEA (300) | 28 | 0.24 | 9 |
| 37 | Poly3 (80) | PAG7 (4) | DRR3' (4) | — | — PGMEA (300) | 13 | 0.24 | 8 |
| 38 | Poly4 (80) | PAG1 (4) | DRR4' (4) | — | — PGMEA (300) | 15 | 0.22 | 8 |

TABLE 5-continued

| | | Resist composition (pbw in parentheses) | | | | | | |
|---|---|---|---|---|---|---|---|---|
| Example | Base resin | Photoacid generator | Dissolution rate regulator | | Basic compound | Solvent | Sensitivity Eop (mJ/cm$^2$) | Resolution ($\mu$m) | Edge roughness (nm) |
| 39 | Poly5 (80) | PAG2 (4) | DRR5' (4) | — | — | PGMEA (300) | 30 | 0.22 | 7 |
| 40 | Poly6 (80) | PAG7 (4) | DRR6' (4) | — | — | DGLM (300) | 9 | 0.22 | 9 |
| 41 | Poly7 (80) | PAG1 (4) | DRR7' (4) | DRR2 (16) | — | EL/BA (300) | 30 | 0.22 | 9 |
| 42 | Poly8 (80) | PAG2 (4) | DRR8' (4) | DRR3 (16) | — | PGMEA (300) | 32 | 0.22 | 8 |
| 43 | Poly9 (80) | PAG7 (4) | DRR1' (4) | DRR4 (16) | — | DGLM (300) | 10 | 0.22 | 5 |
| 44 | Poly10 (80) | PAG1 (4) | DRR2' (4) | DRR5 (16) | — | DGLM (300) | 25 | 0.22 | 5 |
| 45 | Poly11 (80) | PAG3 (4) | DRR3' (4) | DRR11 (16) | — | DGLM (300) | 18 | 0.22 | 5 |
| 46 | Poly12 (80) | PAG1 (4) | DRR4' (4) | DRR6 (16) | — | DGLM (300) | 19 | 0.22 | 5 |
| 47 | Poly13 (80) | PAG1 (4) | DRR5' (4) | DRR7 (16) | — | DGLM (300) | 10 | 0.22 | 4 |
| 48 | Poly14 (80) | PAG2 (4) | DRR6' (4) | DRR8 (16) | — | DGLM (300) | 32 | 0.22 | 4 |
| 49 | Poly4 (80) | PAG4 (4) | DRR7' (4) | DRR9 (16) | — | DGLM (300) | 15 | 0.22 | 5 |
| 50 | Poly4 (80) | PAG5 (4) | DRR8' (4) | DRR10 (16) | — | DGLM (300) | 35 | 0.22 | 5 |
| 51 | Poly4 (80) | PAG1 (3.5) PAG6 (0.5) | DRR8' (4) | DRR12 (16) | — | DGLM (300) | 23 | 0.22 | 5 |
| 52 | Poly5 (80) | PAG7 (4) | DRR1' (4) | DRR13 (16) | — | DGLM (300) | 10 | 0.22 | 5 |
| 53 | Poly5 (80) | PAG8 (4) | DRR2' (4) | DRR14 (16) | — | PGMMA (300) | 14 | 0.22 | 5 |
| 54 | Poly5 (80) | PAG2 (4) | DRR3' (4) | DRR1 (16) DRR12 (4) | — | PGMMA (300) | 14 | 0.22 | 5 |

TABLE 6

| | | Resist composition (pbw in parentheses) | | | | | | |
|---|---|---|---|---|---|---|---|---|
| Example | Base resin | Photoacid generator | Dissolution rate regulator | | Basic compound | Solvent | Sensitivity Eop (mJ/cm$^2$) | Resolution ($\mu$m) | Edge roughness (nm) |
| 55 | Poly4 (80) | PAG1 (4) | DRR7' (4) | — | tetraethylene-diamine (0.2) | PGMEA (300) | 20 | 0.22 | 6 |
| 56 | poly4 (80) | PAG7 (4) | DRR7' (4) | DRR2 (16) | dimethyl-ethylene-diamine (0.2) | PGMEA (300) | 25 | 0.22 | 6 |
| 57 | poly4 (80) | PAG1 (3.5) PAG6 (0.5) | DRR8' (4) | DRR12 (16) | tetramethyl-ethylene-diamine (0.2) | PGMEA (300) | 30 | 0.22 | 4 |
| 58 | poly4 (80) | PAG1 (4) | DRR8' (4) | DRR4 (16) | methylethyl-propylamine (0.2) | PGMEA (300) | 25 | 0.22 | 6 |
| 59 | poly4 (80) | PAG1 (4) | DRR7' (4) | DRR2 (16) | aniline (0.2) | PGMEA (300) | 15 | 0.22 | 6 |
| 60 | poly4 (80) | PAG4 (4) | DRR7' (4) | DRR13 (16) | piperidine (0.2) | PGMEA (300) | 25 | 0.22 | 6 |
| 61 | poly4 (80) | PAG1 (4) | DRR3' (4) | DRR2 (16) | N-methyl-pyrrolidone (0.2) | PGMEA (300) | 15 | 0.22 | 6 |
| 62 | poly6 (80) | PAG1 (4) | DRR3' (4) | DRR1 (16) DRR12 (4) | purine (0.2) | PGMEA (300) | 30 | 0.22 | 4 |
| 63 | poly4 (80) | PAG1 (4) | DRR7' (4) | DRR2 (16) | alanine (0.2) | PGMEA (300) | 15 | 0.22 | 5 |

TABLE 6-continued

| | | Resist composition (pbw in parentheses) | | | | | | |
|---|---|---|---|---|---|---|---|---|
| Example | Base resin | Photoacid generator | Dissolution rate regulator | | Basic compound | Solvent | Sensitivity Eop (mJ/cm$^2$) | Resolution ($\mu$m) | Edge roughness (nm) |
| 64 | poly2 (80) | PAG1 (4) | DRR7' (4) | DRR9 (16) | pyridine-sulfonic acid (0.2) | PGMEA (300) | 15 | 0.22 | 5 |
| 65 | poly4 (80) | PAG4 (4) | DRR7' (4) | DRR9 (16) | 2-hydroxy-pyridine (0.2) | PGMEA (300) | 20 | 0.20 | 5 |
| 66 | poly6 (80) | PAG1 (4) | DRR1' (4) | DRR2 (16) | 2-amino-p-cresole (0.2) | PGMEA (300) | 15 | 0.22 | 5 |
| 67 | poly4 (80) | PAG1 (4) | DRR1' (40) | — | triethanol-amine (0.2) | PGMEA (300) | 20 | 0.20 | 6 |
| 68 | poly4 (80) | PAG1 (4) | DRR8' (4) | DRR2 (16) | N,N-dimethyl-acetamide (0.2) | PGMEA (300) | 20 | 0.22 | 6 |
| 69 | poly1 (80) | PAG1 (2) | DRR9' (8) | — | triethanol-amine (0.1) | PGMEA (300) | 24 | 0.20 | 4 |

It is evident that chemically amplified positive resist compositions within the scope of the invention have high sensitivity and resolution and afford patterned resist films with minimized edge roughness.

Although some preferred embodiments have been described, many modifications and variations may be made thereto in the light of the above teachings. It is therefore to be understood that within the scope of the appended claims, the invention may be practiced otherwise than as specifically described.

What is claimed is:

1. A chemically amplified positive resist composition comprising
   (A) an organic solvent,
   (B) a base resin in the form of a polymer having a recurring unit of the following general formula (1):

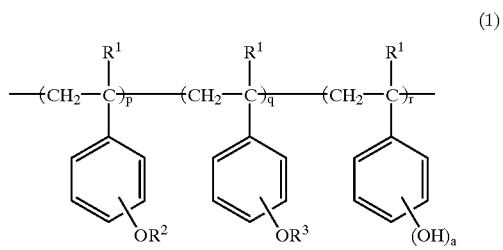

(1)

wherein $R^1$ is a hydrogen atom or methyl group, $R^2$ and $R^3$ are different acid labile groups, letters p, q and r are positive numbers satisfying $0.02 \leq p/(p+q+r) \leq 0.5$, $0.01 \leq q/(p+q+r) \leq 0.3$, $0 < (p+q)/(p+1+r) \leq 0.8$ and letter a is a positive number of 1 to 3, the polymer having a weight average molecular weight of 3,000 to 300,000, and a dispersity of 1.0 to 1.5, and
   (C) a photoacid generator.

2. The resist composition of claim 1 further comprising (D) a dissolution rate regulator.

3. The resist composition of claim 2 wherein the dissolution rate regulator (D) is a compound having a weight average molecular weight of 100 to 1,000 and at least two phenolic hydroxyl groups in a molecule, the hydrogen atom of the phenolic hydroxyl group being replaced by an acid labile group in an overall average proportion of 10% to 100%.

4. The resist composition of claim 2 wherein the dissolution rate regulator (D) is a compound having a weight average molecular weight of more than 1,000 to 3,000 and a phenolic hydroxyl group in a molecule, the hydrogen atom of the phenolic hydroxyl group being partially replaced by an acid labile group in an overall average proportion of more than 0% to 60%.

5. The resist composition of claim 2 wherein the dissolution rate regulator (D) is a mixture of (D-1) a compound having a weight average molecular weight of 100 to 1,000 and at least two phenolic hydroxyl groups in a molecule, the hydrogen atom of the phenolic hydroxyl group being replaced by an acid labile group in an overall average proportion of 10% to 100% and (D-2) a compound having a weight average molecular weight of more than 1,000 to 3,000 and a phenolic hydroxyl group in a molecule, the hydrogen atom of the phenolic hydroxyl group being partially replaced by an acid labile group in an overall average proportion of more than 0% to 60%.

6. The resist composition of claim 3 wherein the compound having a weight average molecular weight of 100 to 1,000 and at least two phenolic hydroxyl groups in a molecule is at least one member selected from compounds of the following general formulae (6) to (16):

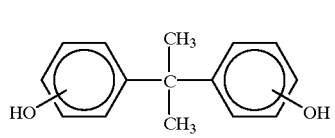

(6)

(7)

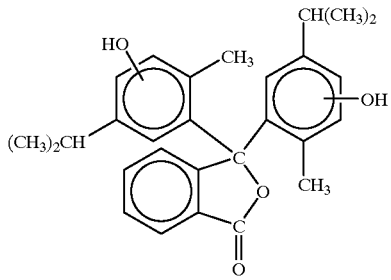

(8)

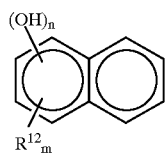

(9)

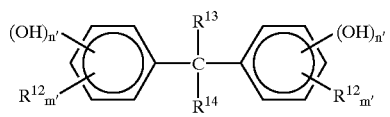

(10)

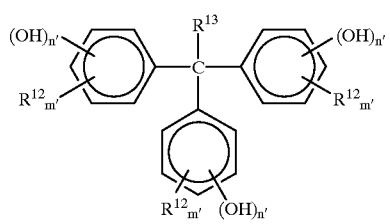

(11)

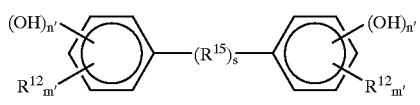

(12)

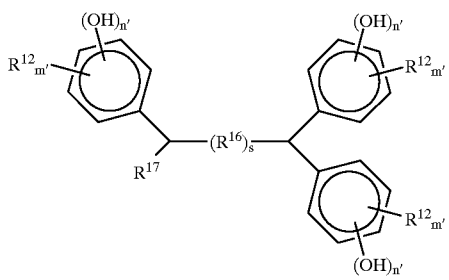

(13)

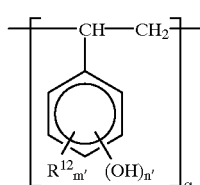

(14)

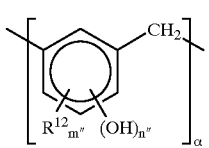

(15)

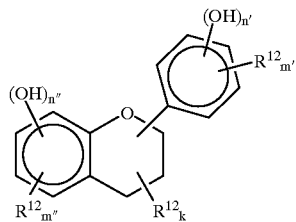

(16)

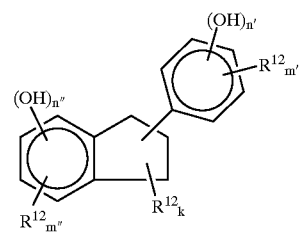

wherein $R^{12}$ and $R^{13}$ are independently selected from the group consisting of hydrogen and normal or branched alkyl and alkenyl groups having 1 to 8 carbon atoms, $R^{14}$ is selected from the group consisting of hydrogen, normal or branched alkyl and alkenyl groups having 1 to 8 carbon atoms, and $(R^{18})_s$—COOH, $R^{15}$ is selected from the group consisting of —$(CH_2)_t$— wherein t is 2 to 10, arylene group having 6 to 10 carbon atoms, carbonyl group, sulfonyl group, oxygen atom, and sulfur atom, $R^{16}$ is selected from the group consisting of an alkylene group having 1 to 10 carbon atoms, arylene group having 6 to 10 carbon atoms, carbonyl group, sulfonyl group, oxygen atom, and sulfur atom, $R^{17}$ is selected from the group consisting of a hydrogen atom, normal or branched alkyl group having 1 to 8 carbon atoms, alkenyl group, hydroxyl-substituted phenyl and naphthyl groups, $R^{18}$ is a normal or branched alkylene group having 1 to 10 carbon atoms, letter k is an integer of 0 to 5, s is 0 or 1, m, n, m', n', m", and n" are numbers satisfying m+n 8, m'+n'=5, and m"+n"=4 such that at least one hydroxyl group is attached to each phenyl skeleton, and α is such a number that the compound of formula (13) or (14) may have a molecular weight of 100 to 1,000.

7. The resist composition of claim 4 wherein the compound having a weight average molecular weight of more than 1,000 to 3,000 and a phenolic hydroxyl group in a molecule is at least one member selected from compounds having a recurring unit of the following general formula (17):

(17)

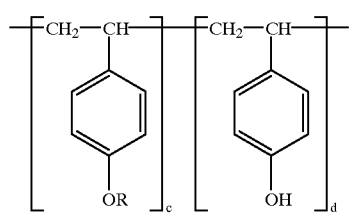

wherein R is an acid labile group, letters c and d are numbers satisfying $0 \leq c/(c+d) \leq 0.6$.

8. The resist composition of claim 1 wherein in formula (1), $R^2$ is a group of the following general formula (2):

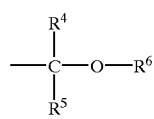
(2)

wherein $R^4$ and $R^5$ are independently selected from the group consisting of a hydrogen atom and normal or branched alkyl group having 1 to 6 carbon atoms, and $R^6$ is a normal, branched or cyclic alkyl group having 1 to 10 carbon atoms, and $R^3$ is selected from the group consisting of a group of the following general formula (3):

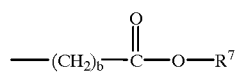
(3)

wherein $R^7$ is a normal or branched alkyl group having 1 to 6 carbon atoms, and letter b is equal to 0 or 1, a tetrahydropyranyl group, a tetrahydrofuranyl group, and a trialkylsilyl group.

9. The resist composition of claim 8 wherein $R^2$ is an alkoxyalkyl group and $R^3$ is a tert-butoxycarbonyl group.

10. The resist composition of claim 1, wherein the base resin (B) is a monodisperse polymer having a dispersity of 1.0 to 1.3.

11. The resist composition of claim 1 wherein the photoacid generator (C) is an onium salt.

12. A chemically amplified positive resist composition comprising (A) an organic solvent, (B) a base resin in the form of a polymer having a recurring unit of the following general formula (1):

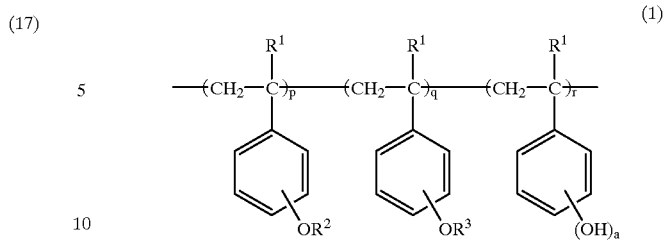
(1)

wherein $R^1$ is a hydrogen atom or methyl group, $R^2$ and $R^3$ are different acid labile groups, letters p, q and r are positive numbers satisfying $0.02 \leq p/(p+q+r) \leq 0.5$, $0.01 \leq q/(p+q+r) \leq 0.3$, $0 < (p+q)/(p+1+r) \leq 0.8$, and letter a is a positive number of 1 to 3, the polymer having a weight average molecular weight of 3,000 to 300,0000, and a dispersity of 1.0 to 1.5, (C) a photoacid generator, and (E) a basic compound additive.

13. A chemically amplified positive resist composition comprising (A) an organic solvent, (B) a base resin in the form of a polymer having a recurring unit of the following general formula (1):

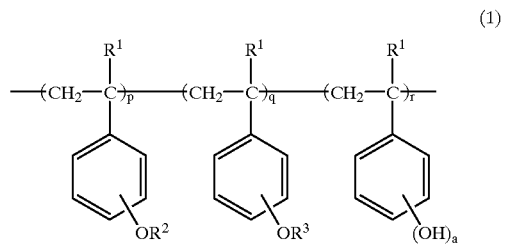
(1)

wherein $R^1$ is a hydrogen atom or methyl group, $R^2$ and $R^3$ are different acid labile groups, letters p, q and r are positive numbers satisfying $0.02 \leq p/(p+q+r) \leq 0.5$, $0.01 \leq q/(p+q+r) \leq 0.3$, $0 < (p+q)/(p+1+r) \leq 0.8$, and letter a is a positive number of 1 to 3, the polymer having a weight average molecular weight of 3,000 to 300,0000, and a dispersity of 1.0 to 1.5, (C) a photoacid generator, and (E) a basic compound capable of suppressing the diffusion rate at which acid generated from photoacid generator (C) diffuses into a resist coating prepared from the resist composition.

14. The resist composition of claim 12, wherein in formula (1), $R^2$ is a group of the formula (2):

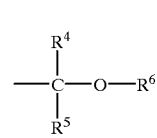
(2)

wherein $R^4$ and $R^5$ are independently selected from the group consisting of a hydrogen atom and normal or branched alkyl group having 1 to 6 carbon atoms with the proviso that $R^4$ and $R^5$ are not hydrogen atom at the same time, and $R^6$ is a normal, branched or cyclic alkyl group having 1 to 10 carbon atoms, and $R^3$ is selected from the group consisting of a group of the following general formula (3):

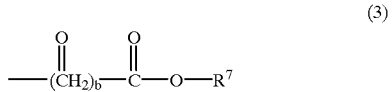
(3)

wherein $R^7$ is a normal or branched alkyl group having 1 to 6 carbon atoms, and letter b is equal to 0 or 1, a tetrahydropyranyl group, a tetrahydrofuranyl group, and a trialkylsilyl group.

15. The resist composition of claim 13, wherein in formula (1), $R^2$ is a group of the following general formula (2):

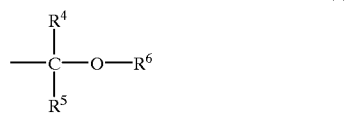
(2)

wherein $R^4$ and $R^5$ are independently selected from the group consisting of a hydrogen atom and normal or branched alkyl group having 1 to 6 carbon atoms with the proviso that $R^4$ and $R^5$ are not hydrogen atom at the same time, and $R^6$ is a normal, branched or cyclic alkyl group having 1 to 10 carbon atoms, and $R^3$ is selected from the group consisting of a group of the following general formula (3):

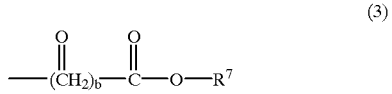
(3)

wherein $R^7$ is a normal or branched alkyl group having 1 to 6 carbon atoms, and letter b is equal to 0 or 1, a tetrahydropyranyl group, a tetrahydrofuranyl group, and a trialkylsilyl group.

16. The resist composition of claim 12, further comprising (D) a dissolution rate regulator.

17. The resist composition of claim 12, wherein the dissolution rate regulator (D) is a compound having a weight average molecular weight of 100 to 1,000 and at least two phenolic hydroxyl groups in a molecule, the hydrogen atom of the phenolic hydroxyl group being replaced by an acid labile group in an overall average proportion of 10% to 100%.

18. The resist composition of claim 12, wherein the dissolution rate regulator (D) is a compound having a weight average molecular weight of 1,000 to 3,000 and a phenolic hydroxyl group in a molecule, the hydrogen atom of the phenolic hydroxyl group being replaced by an acid labile group in an overall average proportion of 0% to 60%.

19. The resist composition of claim 12, wherein the dissolution rate regulator (D) is a mixture of (D-2) a compound having a weight average molecular weight of 100 to 1,000 and at least two phenolic hydroxyl groups in a molecule, the hydrogen atom of the phenolic hydroxyl group being replaced by an acid labile group in an overall average proportion of 10% to 100% and (D-2) a compound having a weight average molecular weight of 1,000 to 3,000 and a phenolic hydroxyl group in a molecule, the hydrogen atom of the phenolic hydroxyl group being partially replaced by an acid labile group in an overall average proportion of 0% to 60%.

20. The resist composition of claim 12, wherein the compound having a weight average molecular weight of 100 to 1,000 and at least two phenolic hydroxyl groups in a molecule is at least one member selected from compounds of the following general formulae (6) to (16):

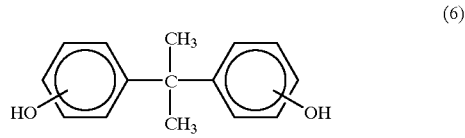
(6)

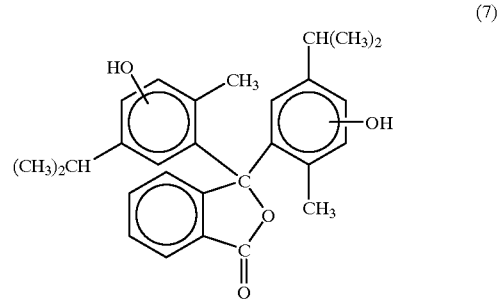
(7)

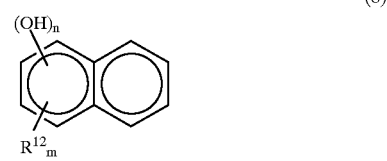
(8)

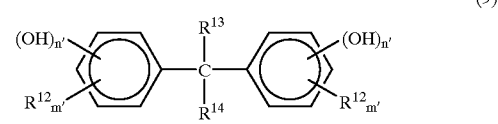
(9)

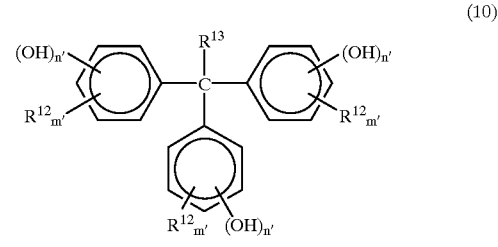
(10)

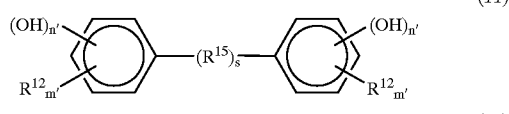
(11)

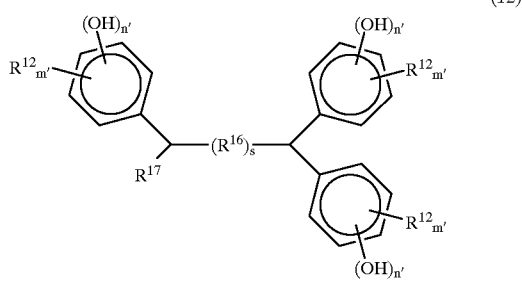
(12)

-continued

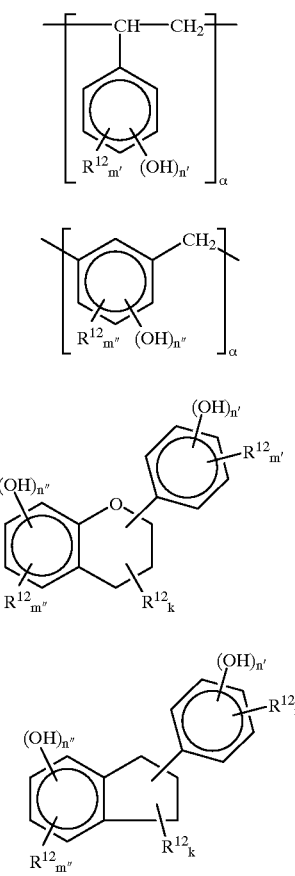

(13)

(14)

(15)

(16)

wherein $R^{12}$ and $R^{13}$ are independently selected from the group consisting of hydrogen and normal or branched alkyl and alkenyl groups having 1 to 8 carbon atoms, $R^{14}$ is selected from the group consisting of hydrogen, normal or branched alkyl and alkenyl groups having 1 to 8 carbon atoms, and $(R^{18})_s$—COOH, $R^{15}$ is selected from the group consisting of —$(CH_2)_t$— wherein t is 2 to 10, arylene group having 6 to 10 carbon atoms, carbonyl group, sulfonyl group, oxygen atom, and sulfur atom, $R^{16}$ is selected from the group consisting of an alkenyl group having 1 to 10 carbon atoms, arylene group having 6 to 10 atoms, carbonyl group, sulfonyl group, oxygen atom, and sulfur atom, $R^{17}$ is selected from the group consisting of a hydrogen atom, normal or branched alkyl group having 1 to 8 carbon atoms, alkenyl group, hydroxyl-substituted phenyl and naphthyl groups, $R^{18}$ is a normal or branched alkylene group having 1 to 10 carbon atoms, letter k is an integer of 0 to 5, s is 0 or 1, m, n, mm',n', m", and n" are numbers satisfying m+n=8, m'+n'=5, and m"+n"=4 such that at least one hydroxyl group is attached to each phenyl skeleton, and α is such a number that the compound of formula (13) or (14) may have a molecular weight of 100 to 1,000.

21. The resist composition of claim 12, wherein the compound having a weight average molecular weight of more than 1,000 to 3,000 and a phenolic hydroxyl group in a molecule is at least one member selected form compounds having a recurring unit of the following general formula (17):

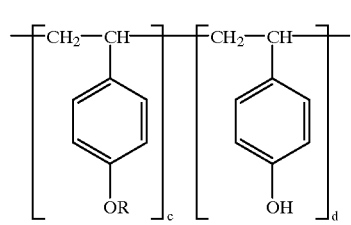

(17)

wherein R is an acid labile group, letters c and d are numbers satisfying $0 \leq c/(c+d) \leq 0.6$.

22. The resist composition of claim 13, further comprising (D) a dissolution rate regulator.

23. The resist composition of claim 13, wherein the dissolution rate regulator (D) is a compound having a weight average molecular weight of 100 to 1,000 and at least two phenolic hydroxyl groups in a molecule, the hydrogen atom of the phenolic hydroxyl group being replaced by an acid labile group in an overall average proportion of 10% to 100%.

24. The resist composition of claim 13, wherein the dissolution rate regulator (D) is a compound having a weight average molecular weight of 1,000 to 3,000 and a phenolic hydroxyl group in a molecule, the hydrogen atom of the phenolic hydroxyl group being replaced by an acid labile group in an overall average proportion of 0% to 60%.

25. The resist composition of claim 13, wherein the dissolution rate regulator (D) is a mixture of (D-1) a compound having a weight average molecular weight of 100 to 1,000 and at least two phenolic hydroxyl groups in a molecule, the hydrogen atom of the phenolic hydroxyl group being replaced by an acid labile group in an overall average proportion of 10% to 100% and (D-2) a compound having a weight average molecular weight of 1,000 to 3,000 and a phenolic hydroxyl group in a molecule, the hydrogen atom of the phenolic hydroxyl group being partially replaced by an acid labile group in an overall average proportion of 0% to 60%.

26. The resist composition of claim 14, wherein the compound having a weight average molecular weight of 100 to 1,000 and at least two phenolic hydroxyl groups in a molecule is at least one member selected from compounds of the following general formulae (6) to (16):

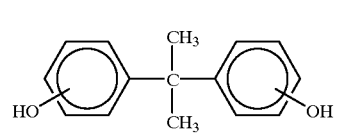

(6)

-continued

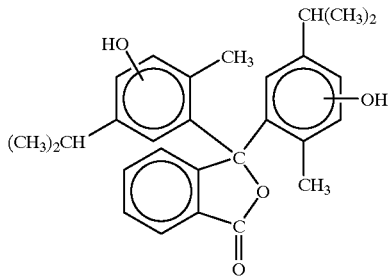
(7)

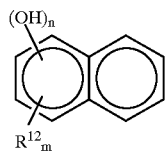
(8)

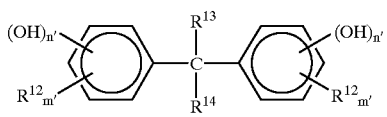
(9)

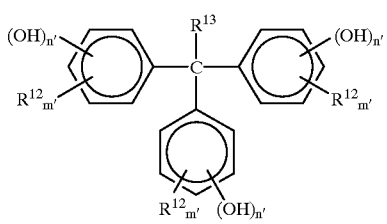
(10)

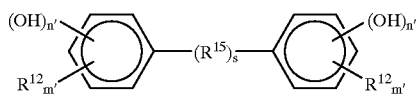
(11)

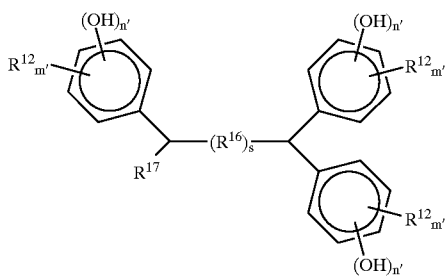
(12)

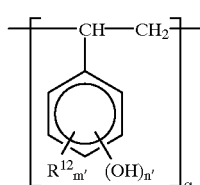
(13)

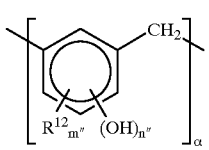
(14)

-continued

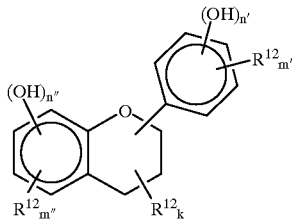
(15)

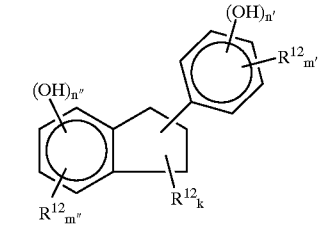
(16)

wherein $R^{12}$ and $R^{13}$ are independently selected from the group consisting of hydrogen and normal or branched alkyl and alkenyl groups having 1 to 8 carbon atoms, $R^{14}$ is selected from the group consisting of hydrogen, normal or branched alkyl and alkenyl groups having 1 to 8 carbon atoms, and $(R^{18})_s$—COOH, $R^{15}$ is selected from the group consisting of —$(CH_2)_t$— wherein t is 2 to 10, arylene group having 6 to 10 carbon atoms, carbonyl group, sulfonyl group, oxygen atom, and sulfur atom, $R^{16}$ is selected from the group consisting of an alkenyl group having 1 to 10 carbon atoms, arylene group having 6 to 10 atoms, carbonyl group, sulfonyl group, oxygen atom, and sulfur atom, $R^{17}$ is selected from the group consisting of a hydrogen atom, normal or branched alkyl group having 1 to 8 carbon atoms, alkenyl group, hydroxyl-substituted phenyl and naphthyl groups, $R^{18}$ is a normal or branched alkylene group having 1 to 10 carbon atoms, letter k is an integer of 0 to 5, s is 0 or 1, m, n, mm',n', m", and n" are numbers satisfying m+n=8, m'+n'=5, and m"+n"=4 such that at least one hydroxyl group is attached to each phenyl skeleton, and α is such a number that the compound of formula (13) or (14) may have a molecular weight of 100 to 1,000.

27. The resist composition of claim 14, wherein the compound having a weight average molecular weight of more than 1,000 to 3,000 and a phenolic hydroxyl group in a molecule is at least one member selected form compounds having a recurring unit of the following general formula (17):

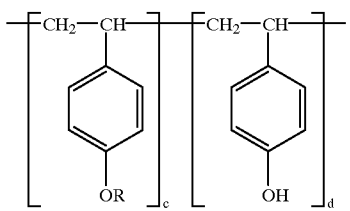

(17)

wherein R is an acid labile group, letters c and d are numbers satisfying $0 \leqq c/(c+d) \leqq 0.6$.

28. The resist composition of claim 12, wherein the basic compound (E) is an amine, a carboxyl-bearing nitrogenous compound, an alcoholic nitrogenous compound, a sulfonyl-bearing nitrogenous compound, a hydroxyphenyl-bearing nitrogenous compound, or an amide compound.

29. The resist composition of claim 13, wherein the basic compound (E) is an amine, a carboxyl-bearing nitrogenous compound, an alcoholic nitrogenous compound, a sulfonyl-bearing nitrogenous compound, a hydroxyphenyl-bearing nitrogenous compound, or an amide compound.

30. The resist composition of claim 12, wherein the basic compound (E) is contained in an amount of 0.001 to 10 parts by weight of the photoacid generator (C).

31. The resist composition of claim 13, wherein the basic compound (E) is contained in an amount of 0.001 to 10 parts by weight of the photoacid generator (C).

32. The resist composition of claim 12, wherein the base resin (B) is a monodisperse polymer having a dispersity of 1.0 to 1.3.

33. The resist composition of claim 13, wherein the base resin (B) is a monodisperse polymer having a dispersity of 1.0 to 1.3.

* * * * *